United States Patent
Heise et al.

(10) Patent No.: US 8,957,684 B2
(45) Date of Patent: Feb. 17, 2015

(54) METHOD FOR DETECTING A FAULT OF AN OPERATING SWITCH FOR INITIATING A VEHICLE FUNCTION OF A VEHICLE AND OPERATING SWITCH FOR CARRYING OUT THE METHOD

(75) Inventors: Andreas Heise, Erzhausen (DE); Ralf Hartmann, Kriftel (DE)

(73) Assignee: Continental Teves AG & Co. Ohg, Frankfurt (DE)

(*) Notice: Subject to any disclaimer, the term of this patent is extended or adjusted under 35 U.S.C. 154(b) by 92 days.

(21) Appl. No.: 13/885,363

(22) PCT Filed: Nov. 22, 2011

(86) PCT No.: PCT/EP2011/070658
§ 371 (c)(1),
(2), (4) Date: Jun. 4, 2013

(87) PCT Pub. No.: WO2012/069461
PCT Pub. Date: May 31, 2012

(65) Prior Publication Data
US 2013/0241563 A1    Sep. 19, 2013

(30) Foreign Application Priority Data

Nov. 23, 2010  (DE) .......................... 10 2010 061 809
Nov. 21, 2011  (DE) .......................... 10 2011 086 756

(51) Int. Cl.
*G01R 31/327* (2006.01)
*G01R 31/08* (2006.01)
*B60T 7/04* (2006.01)
*B60T 7/08* (2006.01)
*B60T 7/10* (2006.01)
*B60T 17/22* (2006.01)
*G01R 31/00* (2006.01)

(52) U.S. Cl.
CPC .............. *G01R 31/327* (2013.01); *B60T 7/042* (2013.01); *B60T 7/085* (2013.01); *B60T 7/107* (2013.01); *B60T 17/221* (2013.01); *G01R 31/007* (2013.01); *G01R 31/3278* (2013.01)
USPC ............................ 324/415; 324/422; 324/522

(58) Field of Classification Search
None
See application file for complete search history.

(56) References Cited

U.S. PATENT DOCUMENTS 2,683,860 A * 7/1954 Reid ............................. 324/545
4,375,672 A * 3/1983 Kato et al. .................... 701/102
7,082,020 B2 * 7/2006 Friedrichs et al. ........... 361/93.9

FOREIGN PATENT DOCUMENTS

DE   199 62 556 A1   7/2001
DE   199 44 461 C1   11/2001

(Continued)

OTHER PUBLICATIONS

PCT International Search Report—Jun. 27, 2012.

*Primary Examiner* — Minh N Tang
(74) *Attorney, Agent, or Firm* — Brinks Gilson & Lione

(57) ABSTRACT

A method for detecting a fault of an operating switch connected to an evaluating unit by at least one signal. The switch having at least a first switch circuit for initiating a vehicle function. A signal that specifies the switch position is sensed by the evaluating unit. The first switch circuit is connected to a first potential of the vehicle electrical system and to the signal line to form a first contact branch. The first switch circuit is bridged by a diode device in the non-conducting direction with respect to the first potential, the evaluating unit generates a test voltage, which is greater than the first potential, the test voltage is applied to the signal line, and, the potential being applied to the signal line of the first contact branch is evaluated by means of the evaluating unit in order to detect a fault.

32 Claims, 15 Drawing Sheets

(56) References Cited

FOREIGN PATENT DOCUMENTS

| DE | 10 2006 009 729 A1 | 6/2007 |
| DE | 10 2008 015 910 A1 | 10/2009 |
| EP | 1 128 999 B2 | 11/1999 |
| WO | WO 00/29268 | 5/2000 |
| WO | WO 02/095282 A2 | 11/2002 |
| WO | WO 2007/014952 A1 | 2/2007 |
| WO | WO 2007/071299 A1 | 6/2007 |

* cited by examiner

Fig. 4a

| | Test driver control devices | | | | Operating switch not actuated | Monitoring control devices | | | |
|---|---|---|---|---|---|---|---|---|---|
| Line mode | S1a | S1b | S2a | S2b | S3 | U1 | U2 | U3 | Detected fault |
| L1,L2,L3 iO | o | o | o | o | o | 0 | 0 | 0 | L1, L2, L3 KL30-Connection Ux=KL30 |
|  | o | o | o | o | g | 0 | 0 | $U_{led}$ | GND detached from switch U3=KL30 |
|  | g | g | g | o | x | >Ub, <Ucp | 0 | x | KL30 detached from switch U1.2=UCP |
|  | o | g | g | o | x | 0 | >Ub, <Ucp | x |  |
| L1=L2 | g | g | o | o | x | >Ub | >Ub | x |  |
| L1=L3 | o | g | g | o | x | >Ub | >Ub | x |  |
| L2=L3 | g | g | o | o | x | <Ub | <Ub | x |  |
| L1=GND | o | g | o | o | x | 0 | 0 | x |  |
| L2=GND | g | g | g | o | x | 0 | 0 | x |  |
| L3=GND | x | x | x | x | g | x | x | 0 |  |
| L1=KL30 | o | x | x | x | x | Ub | x | x |  |
| L2=KL30 | x | x | o | x | x | x | Ub | x |  |
| L3=KL30 | x | x | x | x | o | x | x | Ub |  |

$U_b = U_{Batt}$, $U_{cp} = U_{Test}$
= is short-circuited with respect to ...
o is open
g is closed
X is user-defined
iO is OK / no defect

Fig. 4b

| | Test driver control devices | | | | | Monitoring control devices | | | |
|---|---|---|---|---|---|---|---|---|---|
| Line mode | S1a | S1b | S2a | S2b | S3 | U1 | U2 | U3 | Test |
| L1,L2,L3 iO | o | o | o | o | x | Ub | 0 | x | S1.1 or KL30 connection L1 |
| | g | o | o | g | x | Ub-I2*R | 0 | x | S1.1 connected |
| | o | g | g | o | x | Ub | Ud+If*R | x | S1.2 connected |
| SW-KL30 loss | g | g | o | o | x | Ucp | 0 | x | Ub = U$_{Batt}$, Ucp = U$_{Test}$ |
| SW-GND loss | o | o | o | o | o | Ub | 0 | Ub-2*Ud | = is short-circuited with respect to ... |
| L1=L2 | o | x | o | x | x | Ub/2+Ud | Ub/2+Ud | x | o is open |
| L1=L3 | o | x | g | o | o | Ub/2+U$_{led}$ | x | U1 | g is closed |
| L2=L3 | o | g | g | o | o | x | >Ud+I1*R | U2 | X is user-defined |
| L1=GND | g | g | o | o | x | 0 | 0 | x | iO is OK /no defect |
| L2=GND | o | o | g | o | x | Ub | 0 | x | |
| L3=GND | x | x | x | x | g | x | x | 0 | |
| L1=KL30 | o | x | x | x | x | Ub | x | x | |
| L2=KL30 | x | x | o | x | x | x | Ub | x | |
| L3=KL30 | x | x | x | x | o | x | x | Ub | |

Operating switch "Apply"

Fig. 4c

Operating switch "Release"

| | Test driver control devices | | | | | Monitoring control devices | | | Test |
|---|---|---|---|---|---|---|---|---|---|
| Line mode | S1a | S1b | S2a | S2b | S3 | U1 | U2 | U3 | |
| L1,L2,L3 iO | o | o | o | o | x | 0 | Ub | x | S2.2 or KL30 connection L2 |
| | o | o | g | g | x | 0 | Ub-I2*R | x | S2.2 connected |
| | g | g | o | o | x | Ud+I1*R | Ub | x | S2.1 connected |
| SW-KL30 loss | o | o | g | g | x | 0 | Ucp | x | Ub = U_Batt, Ucp = U_Test |
| SW-GND loss | g | g | o | o | x | >Ud+I1*R | Ub | x | = is short-circuited with respect to ... |
| L1=L2 | o | x | o | x | x | Ub/2+Ud | Ub/2+Ud | x | o is open |
| L1=L3 | g | g | o | o | o | <Ud+I1*R | Ub | U1 | g is closed |
| L2=L3 | o | o | g | g | o | 0 | <Ub-I2*R | U2 | X is user-defined |
| L1=GND | g | g | o | o | x | 0 | Ub | x | iO is OK /no defect |
| L2=GND | o | o | g | o | x | 0 | 0 | x | |
| L3=GND | x | x | x | x | g | x | x | 0 | |
| L1=KL30 | o | x | x | x | x | Ub | x | x | |
| L2=KL30 | x | x | o | x | x | x | Ub | x | |
| L3=KL30 | x | x | x | x | o | x | x | Ub | |

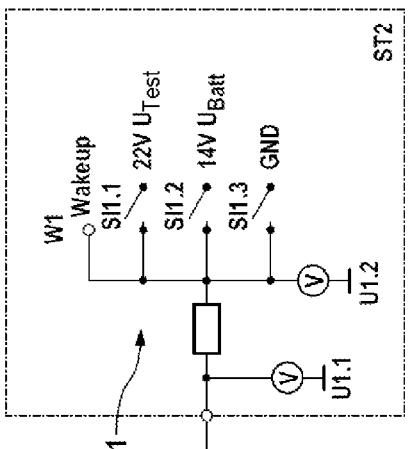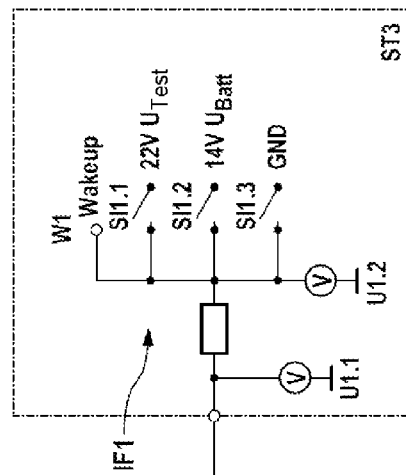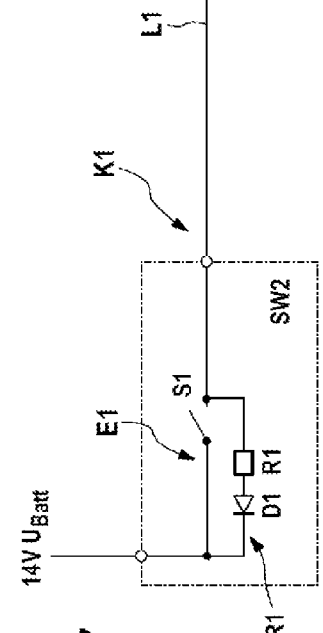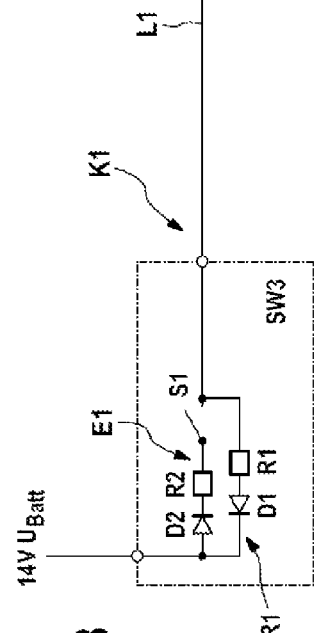
Fig. 7
Fig. 8

METHOD FOR DETECTING A FAULT OF AN OPERATING SWITCH FOR INITIATING A VEHICLE FUNCTION OF A VEHICLE AND OPERATING SWITCH FOR CARRYING OUT THE METHOD

CROSS-REFERENCE TO RELATED APPLICATIONS

This application claims priority to German Patent Application Numbers 10 2010 061 809.8, filed Nov. 23, 2010; 10 2011 086 756.2, filed Nov. 21, 2011; and PCT/EP2011/070658, filed Nov. 22, 2011.

FIELD OF THE INVENTION

The invention relates to a method for detecting a fault of an operating switch that is connected to an evaluating unit by means of at least one signal line, which operating switch comprises at least a first switch circuit for initiating a vehicle function of a vehicle and an operating switch for performing the method.

BACKGROUND OF THE INVENTION

Modern vehicles comprise in many cases electronic parking brake systems, in particular systems of the type where, in response to a request by the driver, electric actuators actuate a tensioning device on the friction brakes of the rear axle. Owing to the great concern for safety, electric operated parking brakes of this type must comply with different judicial and accordingly legal requirements.

In the case of a parking brake operating switch that is embodied as an operating switch and its connection to an evaluating unit as a control unit that controls the parking brake it is therefore necessary that individual faults such as short circuits in individual lines with respect to each other or with respect to one of the supply voltages, interruptions in a line and defects in the switching contacts are detected in a reliable manner as early as possible, irrespective of the parking brake being actuated. Fault tolerance with respect to an individual fault is also necessary in some cases since the parking brake must be actuated in response to a request by the driver even in the presence of an individual fault.

EP 1 128 999 B2 discloses a device and a method for controlling an electric operated parking brake, wherein an input device comprises an electric switching means having a plurality of switch positions, which electric switching means is coupled to switches that are embodied in a redundant manner and are arranged in parallel-functioning switch circuits having their own energy supply and ground connection. The input device emits at least two redundant output signals in each switch position, wherein in addition in each case at least two signal lines are allocated to each switch circuit. At least eight lines are disadvantageously necessary for the connection between the input device and control device.

DE102008015910 discloses a method for testing the functionality of a switching unit that comprises a plurality of switches and at least one preferably internal control unit and can be connected by way of at least one interface unit to an external control device. In this case, the functionality of the switching unit is tested using an internal diagnostic routine that is embodied in the control device or using an external diagnostic route that is embodied in the external control device, wherein the diagnostic routines generate at least one test signal that is transmitted to at least one of the switches, and input signals that are received from the switches are evaluated in the control unit. In that system, the switching unit is expensive owing to the internal control unit, at least five lines would be necessary when using an external control unit.

WO2009/0658264 discloses a device for electrically actuating a system where safety is of great concern and which device comprises at least two connections, at least one switch and an operating element by means of which the at least two operating modes can be selected for the system, by means of which device switch positions of the at least one switch are determined. By using at least one current direction element, it is achieved that current flows in a uni-direction between the at least two connections, the current direction for a first operating mode being in the direction from the first terminal to the second terminal and for a further operating mode in the reverse direction from the second terminal to the first terminal. It is therefore necessary to have at least four terminals and accordingly four lines between the switching unit and the control device in order to provide a tolerance with respect to an individual fault.

In addition to the lines necessary in order for a request to be made that the parking brake is to be actuated, it is often the case that one or two further lines are routed to the parking brake operating switch, which lines render it possible to control a signal light in or on the switch. As a consequence, the operating mode of the parking brake (applied or released) can be displayed and/or the switch illuminated.

It follows from this, that an operating switch for a parking brake having the switch positions Apply/Idle/Release and an illuminated display requires in accordance with the prior art at least five lines between the parking brake control device and parking brake operating switch.

The object of the present invention is therefore to provide a method for detecting a fault of an operating switch of the type mentioned in the introduction, with which method an individual fault can be detected in a reliable manner as early as possible, preferably without a fault of this type having a negative influence on the detection of the switching mode and by means of a method of this type in accordance with the invention it is rendered possible to achieve an operating switch having a smallest possible number of connection lines between the operating switch and control device. Furthermore, it is the object of the invention to provide an operating switch for performing the method in accordance with the invention.

The first object mentioned is achieved by means of a method having the features described herein.

INTRODUCTORY DESCRIPTION OF THE INVENTION

A method of this type for detecting a fault of an operating switch that is connected to an evaluating unit by means of at least one signal line and comprises at least a first switch circuit for initiating a vehicle function of a vehicle, wherein a signal that specifies a switch position for initiating the vehicle function is sensed by the evaluating unit and evaluated, is characterized in accordance with the invention in that:
  the first switching plane is connected at one end to a first potential of the vehicle electrical system voltage of the vehicle and it can be connected at the other end to the signal line in order to form a first contact branch in a first switch position,
  the first switch circuit is bridged by a diode device in the non-conducting direction with respect to the first potential of the vehicle electrical system voltage,
  the evaluating unit generates a test voltage, the magnitude of which is greater than the first potential, the test voltage is applied to the signal line of the first contact branch, and, the potential that is being applied to the signal line of the first contact branch is evaluated by means of the evaluating unit in order to detect a fault.

This method in accordance with the invention renders it possible to detect a fault relating to the connection of the operating switch to a vehicle electrical system of a vehicle and said method is performed using a test voltage, which test voltage is, for example, greater than the positive potential when a switch circuit of the operating switch is connected to the positive potential as the first potential of a vehicle electrical system voltage or is negative when the switch circuit of the operating switch is connected to the reference potential as the second potential of the vehicle electrical system voltage. It is thus possible when this test voltage is applied by means of the diode device, which is connected in the non-conducting direction, to the signal line that is connected to the switch circuit to detect if the operating switch is detached from the voltage supply, either when the operating switch is in the non-actuated mode or also when it is in the actuated mode.

This method in accordance with the invention renders it possible to use make-contact elements, as a consequence of which a high level of design freedom is available for producing the operating switch.

If the system comprising an operating switch having a signal line and an evaluating unit in a stand-by-mode, the signal line can be embodied in a non-energized manner even if the evaluating unit is wake-up capable.

In an embodiment of the invention it is provided that the operating switch is embodied in the first switch position with a second parallel switch circuit, the second switch circuit is bridged by a diode device in the non-conducting direction with respect to the first potential of the vehicle electrical system voltage, and in order to form a second contact branch the second switch circuit can be connected by way of a further signal line to the evaluating unit.

An operating switch of this type and embodied, for example, as a switch key is embodied with the two switch circuits in a simply redundant manner and with the associated two signal lines provides simply redundant switching signals in order that the switch position can be clearly detected. Since the two switch circuits are bridged in each case by a diode device, it is possible to detect if the operating switch is detached from the first potential of the vehicle electrical system voltage, in other words, for example, from the positive potential of the vehicle electrical system voltage, in each case by way of two signal lines, wherein in accordance with a further development the second contact branch is connected to the first potential of the vehicle electrical system voltage of the vehicle, the test voltage is applied to the signal line of the second contact branch and the potential that is being applied to the signal line of the second contact branch is evaluated by the evaluation unit in order to detect the fault.

This simple redundancy with respect to the switch circuit of an operating switch can be further increased in accordance with an advantageous development of the invention, wherein the operating switch in the first switch position is embodied with a third parallel switch circuit, the third switch circuit is bridged by a diode device in the non-conducting direction with respect to the first potential of the vehicle electrical system voltage, and, in order to form a third contact branch, the third switch circuit can be connected by way of a further signal line to the evaluating unit. It is also possible with this third contact branch to detect if the operating switch is detached from the supply voltage, wherein the test voltage is applied also to the signal line of the third contact branch, and the potential that is being applied to the signal line of the third contact branch is evaluated by means of the evaluating unit in order to detect a fault.

Furthermore, it is provided in accordance with an embodiment of the invention to connect the contact planes that are redundant in one switch position not to the same potential of the vehicle electrical system voltage but rather to connect in each case to different potentials of the vehicle electrical system voltage, in other words it is provided that the second contact branch is connected to a second potential of the vehicle electrical system voltage. Accordingly, it is also possible with three parallel switch circuit, to connect the third switch circuit, in other words the third contact branch, to the second potential of the vehicle electrical system voltage.

It is particularly advantageous to use the method in accordance with the invention for an operating switch having a second switch position that comprises two parallel switch circuits, so that the first and the second switch circuit on the one hand is connected to a second potential of the vehicle electrical system voltage and on the other hand the first switch circuit is connected to the first contact branch and the second switch circuit is connected to the second contact branch. Consequently, it is also possible to detect the second switch position by means of the evaluating unit by way of the two signal lines and to perform corresponding test procedures.

Furthermore, it is provided in accordance with a further development also to provide an operating switch having three parallel contact planes in a first switch position also three switch circuits in a second switch position and to connect to the second potential of the vehicle electrical system voltage and accordingly to the respective contact branches of the switch circuits of the first switch position.

The method in accordance with the invention can be used in accordance with a further development also for operating switches of the type where their redundant switch circuits are connected in a first switch position to different potentials of the vehicle electrical system voltage and in a second switch position likewise comprise corresponding redundant switch circuits. For this purpose, the first switch circuit is connected at one end to the first potential of the vehicle electrical system voltage and at the other end to the second contact branch, whereas the second switch circuit is connected at one end to the second potential of the vehicle electrical system voltage and at the other end to the first contact branch.

A similar effect is also achieved in an advantageous manner with an operating switch having three parallel contact planes in a first switch position, which is not all connected to the same potential of the vehicle electrical system voltage. In accordance therewith, it is provided in accordance with a further development that the operating switch can be actuated into a second switch position having a first switch circuit and thereto parallel second and third switch circuits, the first switch circuit is connected at one end to a first potential of the vehicle electrical system voltage, preferably to a first potential of a further vehicle electrical system voltage and at the other end to the first contact branch and the second switch circuit and the third switch circuit are connected at one end to the second potential of the vehicle electrical system and at the other end the second switch circuit is connected to the second contact branch and the third switch circuit is connected to the third contact branch.

As already mentioned above, the method in accordance with the invention is embodied in such a manner that a higher magnitude than the positive potential of the vehicle electrical system voltage is used as a test voltage if the switch circuits that are bridged by the diode device are connected to this positive potential of the vehicle electrical system voltage or conversely, if switch circuits of this type are connected to the reference potential of the vehicle electrical system voltage, a negative voltage with respect to the reference potential is generated as a test voltage.

In a further embodiment of the invention, the operating switch is embodied with at least one light-emitting diode that is connected by way of an LED line to the evaluating unit. Consequently, this light-emitting diode can also be controlled by means of the evaluating unit to display the mode of the vehicle function that can be actuated by means of the operating switch.

An LED line of this type can be used in an advantageous manner for the purpose of supplying the reference potential of the vehicle electrical system to the operating switch; in particular also if the evaluating unit has detected that the GND connection to the operating switch is detached.

Furthermore, it is possible in accordance with a further development of the invention that, in order to continue to detect a fault, the vehicle electrical system voltage or the reference potential of the vehicle electrical system voltage is applied to the first and/or the second contact branch by means of the evaluating unit and in dependence upon the switch position of the operating switch the potential that is being applied to the lines of the contact branches is sensed and evaluated. It is thus possible in all switch positions to detect faults, such as short circuits or line fractures, by applying different voltages to the signal lines and correspondingly evaluating the prevailing potentials.

It is also advantageous to protect the switching contacts of the operating elements by means of a current limiting element, preferably an electric resistor, for example if a voltage is incorrectly applied "hard" to the switching contacts of the switch circuits. Diodes can also be used in addition for this purpose.

Overall, a system comprising an operating switch, signal lines and an evaluation unit is provided with this method in accordance with the invention, said system being extremely sensitive to EMC couplings and potential differences in the vehicle electrical system.

The second mentioned object is also achieved by means of the features described herein.

An operating switch of this type that comprises at least one make-contact element that forms a first switch circuit for initiating a vehicle function of a vehicle and is connected to an evaluating unit by means of at least one signal line is characterized in accordance with the invention in that:

the first switch circuit is connected at one end to a first potential of the vehicle electrical system voltage of the vehicle and is connected at the other end to the signal line in order to form a first contact branch in a first switch position, a diode device is provided that bridges the first switch circuit in the non-conducting direction with respect to the first potential of the vehicle electrical system voltage, the evaluating unit comprises a test voltage generating unit for generating a test voltage, the magnitude of which is greater than the first potential, the evaluating unit is embodied to apply the test potential to the signal line of the first contact branch and to evaluate the potential that is being applied to the signal line of the first contact branch in order to detect a fault.

An operating switch of this type having only make-contact elements comprises a simple and robust structure that is insensitive in particular with respect to EMC interferences.

Advantageous embodiments of the operating switch in accordance with the invention are provided.

The method in accordance with the invention is advantageous for the use of an operating switch in a motor vehicle, in particular in order to operate an electronic parking brake system.

BRIEF DESCRIPTION OF THE DRAWINGS

The invention is described in detail hereinunder with the aid of exemplary embodiments with reference to the attached drawings, in which:

FIG. 4 shows a table illustration for test procedures and detecting a fault of an operating switch in accordance with FIG. 3, FIG. 7 shows a circuit arrangement as a further exemplary embodiment of the method in accordance with the invention comprising an operating switch having a switch circuit, FIG. 8 shows a circuit arrangement as a further exemplary embodiment of the method in accordance with the invention comprising an operating switch in accordance with FIG. 7 having in addition the ability to detect a short circuit of the signal line with respect to a supply voltage.

DETAILED DESCRIPTION OF THE INVENTION

Figure 1:
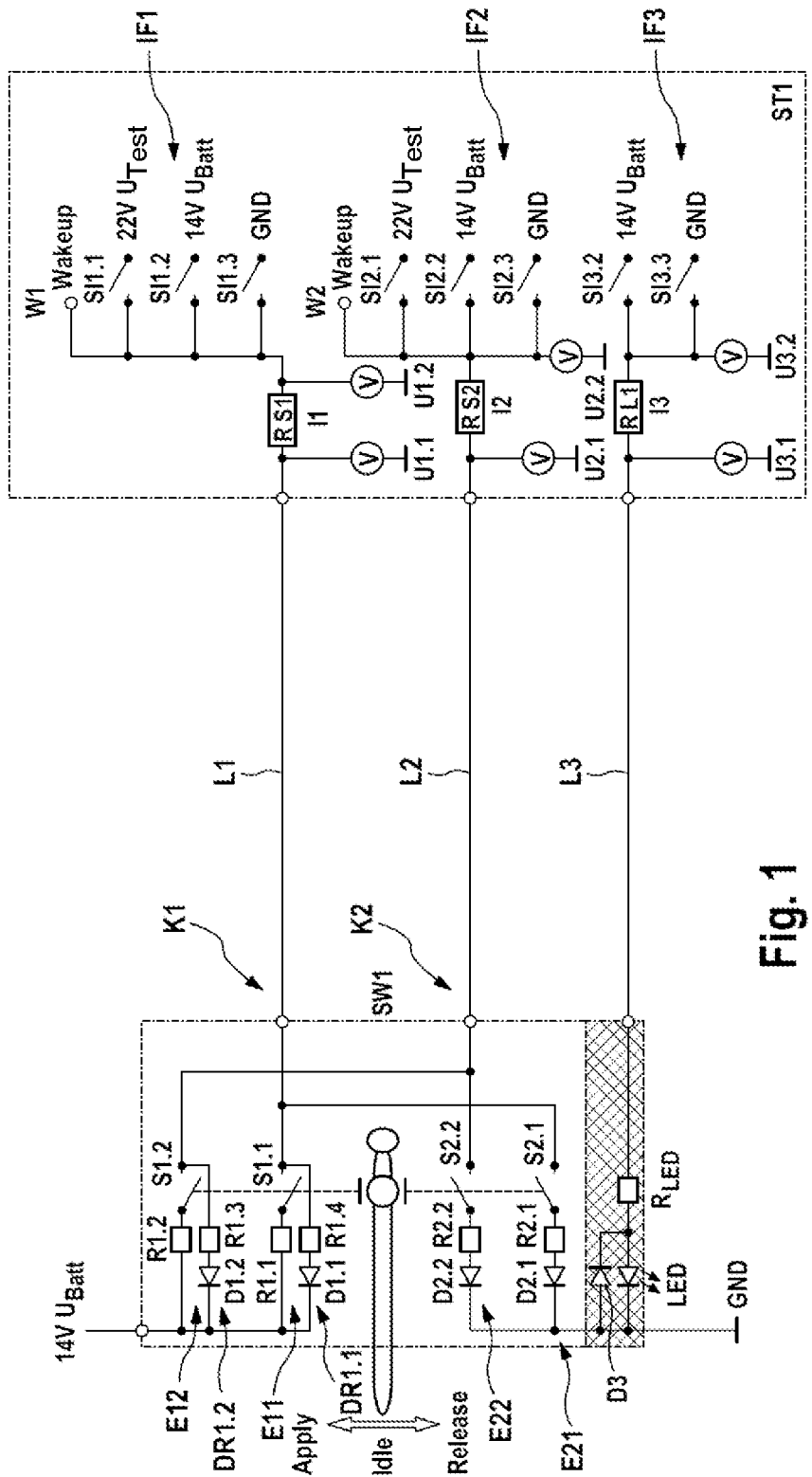
FIG. 1 shows a circuit arrangement as an exemplary embodiment of the method in accordance with the invention comprising an operating switch having three switch positions and an LED display.

FIG. 1 illustrates a parking brake switch as an operating switch SW1 that is connected by way of two signal lines L1 and L2 and an LED line L3 to a control device, for example a parking brake control device as an evaluating unit ST1. These lines L1, L2, and L3 are connected to the control device ST1 in each case by way of an interface circuit IF1, IF2, and IF3. In order to sense the desire of the driver, the parking brake control device ST1 detects the switch position of the operating switch SW1 and then initiates the corresponding function, in other words either applying the parking brake or releasing the parking brake.

The operating switch SW1 in accordance with FIG. 1 comprises three positions, a neutral position (Idle), a first switching mode (Apply), with which the function "Apply the parking brake" is initiated, and a second switching mode (Release) with which the function "Release the parking brake" is initiated.

The operating switch SW1 comprises in each of these switch positions simply redundant switch circuits, in other words in each case two switch circuits E11 and E12 and accordingly E21 and E22 in the first and second switch position respectively. Each of these switch circuits comprises a make-contact element S1.1 and S1.2 and accordingly S2.1 and S2.2 as a switching contact to which in each case a protective resistor R1.1 and R1.2 and accordingly R2.1 and R2.2 is connected in series. Furthermore, in each case a diode D2.1 and D2.2 is connected in the second switch position in the conducting direction in series to the resistors R2.1 and R2.2 of the two switch circuits E21 and E22.

If the operating switch SW1 is actuated into its first switch position "Apply", the switching contacts S1.1 and S1.2 are closed. As the operating switch SW1 is actuated into the second switch position "Release", the switching contacts S2.1 and S2.2 are closed. When the operating switch SW1 is in the non-actuated mode, it remains in its neutral position (Idle).

The two switch circuits E11 and E12 are connected in the first switch position at one end to the positive potential of the vehicle electric system voltage $U_{Batt}$, in other words, for example at 14V, and at the other end the switch circuit E11 and accordingly E12 are connected to the signal line L1 and L2 respectively to form a first and accordingly second contact branch K1 and K2 respectively, which signal lines L1 and L2 are connected for their part to an interface circuit IF1 and IF2 respectively of the control device ST1.

Furthermore, these two switch circuits E11 and E12 are bridged in each case by a diode device DR1.1 and DR1.2 respectively, said diode device being embodied from a series-connected diode D1.1 and a resistor R1.4 and accordingly a diode D1.2 and a resistor R1.3, wherein the two diodes D1.1 and D1.2 are polarized in this case in the non-conducting direction with respect to the vehicle electric system voltage $U_{Batt}$.

The two switch circuits E21 and E22 of the second switch position of the operating switch SW1 are connected at one end to the reference potential of the vehicle electric system voltage as the ground GND and are directed at the other end to the first and accordingly second contact branch K1 and K2 respectively and are connected at this site to the first and accordingly second switch circuit E11 and E22 respectively.

Furthermore, the operating switch SW1 comprises a signal light LED that is connected by way of the LED line L3 to an interface circuit IF3 of the control device ST1 and is controlled by said control device to display the mode of the function that can be actuated using the operating switch (in other words, the parking brake is applied or released). This light-emitting diode LED is connected directly to the ground GND of the vehicle electric system voltage and is connected to the LED line L3 by way of a protective resistor $R_{LED}$.

Furthermore, a diode D3 is connected in an anti-parallel manner with respect to the light-emitting diode LED, so that, for example, in the event that the operating switch SW1 becomes detached from the ground GND, a ground supply can be provided by way of the LED line L3 by means of the control device ST1. The LED line L3 is used to check that the operating switch SW1 is connected to ground GND. At the same time, this LED line L3 can be used to control the LED, so that it is possible by means of using this line twice in this manner to omit one wire connection line.

Optionally, the light-emitting diode LED can be omitted but it is then still necessary to provide a line L3 between the operating switch SW1 and the control device ST1, wherein this line L3 would be connected in the operating switch SW1 to ground GND.

The interface circuits IF1 and IF2 are embodied in an identical manner for the first and second contact branch K1 and K2. It is possible by way of a sensor resistor RS1 and accordingly RS2 that is connected to the signal line L1 and L2 respectively either to apply a test voltage $U_{Test}$ by way of a switch SI1.1 and SI2.1 respectively, to apply the vehicle electrical system voltage $U_{Batt}$ by way of a switch SI1.2 and SI2.2 respectively or to apply the ground GND by way of a switch SI1.3 and SI2.3 respectively. Furthermore, the voltages U1.1 and U1.2 and accordingly U2.1 and U2.2 are sensed at the sensor resistances RS1 and RS2 and evaluated by the control unit ST1.

The interface circuit IF3 comprises a switch SI3.2 and a switch SI3.3 that connect the vehicle electrical system voltage $U_{Batt}$ and accordingly the ground GND by way of a sensor resistor RL1 to the LED line L3. The voltage U3.1 and U3.2 that occur at the sensor resistor are sensed by the control device ST1 and evaluated.

In order to avoid an unnecessarily high power loss and the battery correspondingly discharging when a vehicle is idle and/or parked, control devices are switched off; said control devices can also be switched off using the control device ST1 that supports a wakeup function. The sensor resistors RS1 and accordingly RS2 of the first and accordingly second contact branch K1 and K2 respectively are connected to a wakeup input W1 and accordingly W2 of the control device, so that as the operating switch SW1 is actuated into the "Apply" position, the control device ST1 can be woken from a standby mode in order to allow the corresponding function to be performed. As a result of the redundant structure of the operating switch SW1, this wakeup function is also provided in a redundant manner in the control device ST1 in order to reliably ensure that the standby mode is energized in accordance with the relevant specifications.

If, for example, the operating switch SW1 is actuated in the direction of its first switch position "Apply", only the switching contacts S1.1 and S1.2 are closed, as a consequence of which the vehicle electrical system voltage $U_{Batt}$ is connected to the signal line L1 and L2 respectively by way of the switching contact S1.1 and the protective resistor R1.1 and also by way of the switching contacts S1.2 and the protective resistor R1.2, so that a wakeup signal is generated in each case at these two sensor resistors RS1 and RS2, in order thereby, for example, to connect a wakeup signal to the voltage controller for the test voltage $U_{Test}$ or, in the event that current sources are used in place of the voltage sources, to connect said current sources. Consequently, in principle, a leakage-free wakeup function is provided for the control device ST1.

Consequently, when the control device ST1 is in the standby mode and the operating switch SW1 is in the non-actuated mode, there is no current, apart from the negligible leakage current, flowing through the diodes D1.1 and D1.2 of the diode devices DR1.1 and DR1.2. Consequently, there is no positive potential of the vehicle electrical system voltage at the signal lines L1 and L2 in the standby mode, so that leakage currents or creeping currents do not occur at this site. This also applies for the LED line L3, since in the standby mode this LED line L3 is not controlled and therefore there is also no positive potential of the vehicle electrical system voltage.

If the control device ST1 is woken from the standby mode, different procedures are performed to check the operating switch SW1 and its cabling and also a read out of the switch positions. These procedures can be performed either strictly according to a predetermined plan or depending upon the situation, for example, in a manner tailored to suit the prevailing switch position.

The function of the switch is checked by means of systematically sampling and accordingly connecting different voltages (or currents) and evaluating the effects by way of the voltage drop at the resistors RS1, RS2 and accordingly RS3 of the interface circuits IF1, IF2 and IF3.

The signal lines L1 and L2 are connected for a short period of time to different test voltages or test currents, wherein for this purpose a test voltage $U_{Test}$ is also used as a test voltage, the magnitude of which is greater than that of the vehicle electrical system voltage $U_{Batt}$, in other words $|U_{Test}|>|U_{Batt}|$ applies and $U_{Test}$ amounts, for example, to 22V.

In the case of a non-actuated operating switch SW1, the connection to voltage levels below the vehicle electrical system voltage $U_{Batt}$ leads to the potential on the signal line L1 or L2 being adapted to the applied potential. In response thereto, the respective other lines L2 and L3 or L1 and L3 in the mode connected to a potential or in a mode not connected to a potential follow their desired level or remain substantially at their previous level. Apart from the compensatory currents that arise substantially as a result of the capacitive or inductive couplings, no noticeable effects occur.

A short circuit on one of the signal lines L1 or L2 with respect to the vehicle electrical system voltage $U_{Batt}$ is detected by means of the control unit ST1. A short circuit with respect to one of the respective other lines L2 or L3 and accordingly L1 or L3 is likewise detected, since the test voltages provided for this purpose also act on these lines L2 or L3 and accordingly L1 or L3 and therefore a short circuit can be detected.

The proper connection of the operating switch LW1 to KL30, in other words to the positive potential of the vehicle electrical system voltage $U_{Batt}$, is connected using the test voltage $U_{Test}$ already described above, the magnitude of which is greater than the vehicle electrical system voltage $U_{Batt}$, for example, by means of the switch SI1.1 of the interface circuit IF1 of the control device ST1 to the signal line L1. If this greater magnitude of the test voltage $U_{Test}$ is connected at the diode device DR1.1 with respect to a voltage that is possibly slightly offset from $U_{Batt}$ at the control device SW1 with respect to the supply voltage $U_{Batt}$ that is connected to the control device ST1, this contact branch K1 acts in the operating switch SW1 as a current drain or a voltage reducer, the effect of which on the measuring voltage U1.1 or on an impressed current I1 can be measured. Consequently, it is possible to test and accordingly check that the operating switch SW1 is properly connected to the vehicle electrical system voltage $U_{Batt}$, wherein in this case the signal line L2 is not influenced. Accordingly, the reverse also applies if the test voltage $U_{Test}$ is applied to the signal line L2.

If the test voltage $U_{Batt}$ is applied to the first contact K1 when the operating switch SW1 is in the neutral position, the measuring voltage U1.1 demonstrates in the case of a proper connection to the vehicle electrical system voltage $U_{Batt}$ a magnitude that is between the magnitude of the test voltage $U_{Test}$ and the magnitude of the vehicle electrical system voltage $U_{Batt}$, then $U_{Batt}<U1.1<U_{Test}$ applies.

If the operating switch SW1 in the neutral position is detached, then $U1.1=U_{Test}$ applies.

If the test voltage $U_{Test}$ is applied to the signal line L1 when the vehicle electrical system voltage is detached in the first switch position "Apply" of the operating switch SW1, then the signal line L2 is drawn by way of the series-connected switch circuits E11 and E12 to the voltage level of the test voltage $U_{Test}$. The integrity of the mode can, in turn, be reliably detected by connecting to different loads and the resultant test voltages or test currents.

By appropriately selecting the resistors R1.2, R1.3, R2.1 and R2.2, which can in parts also be selected to be different, it is still also possible to evaluate the case that the vehicle electrical system voltage $U_{Batt}$ at the control device SW1 is low impedance, in other words is, for example, short-circuited with respect to ground GND, although in this case a leakage current can flow towards the ground GND by way of the diodes D1.1 and D1.2 of the diode devices DR1.1 and DR1.2 and the additionally actuated operating switch SW1. The wakeup function can no longer be performed by way of the operating switch SW1 in the case of this fault.

Accordingly, the test can also be performed on the signal line L2.

Furthermore, the connection of the operating switch SW1 to the ground connection, in other words to the ground GND, can also be tested by means of connecting a test voltage or a current to the LED line L3 for a short period of time, wherein a current of this type is limited by the resistor $R_{LED}$ and the resistance of the light-emitting diode LED.

If the operating switch SW1 becomes detached from the ground connection GND, it is then possible in accordance with FIG. 1 to generate sufficient ground connection for the operating switch SW1 by means of the diode D3 that is connected in an anti-parallel manner with respect to the light-emitting diode LED either in series with the resistor $R_{LED}$ or in parallel with the light-emitting diode LED and the resistor $R_{LED}$ by connecting the LED line L3, e.g. to the ground level GND, so that a sufficiently reliable switching signal can still be detected.

If the operating switch SW1 is actuated into its first switch position "Apply", then the level of the positive potential of the vehicle electrical system voltage is connected to the signal line L1 by way of the resistor R1.1 of the switching contact S1.1. The control device ST1 can then for its part, by means of connecting different voltages and currents, e.g. GND or $U_{Test}$ by means of the switches in the interface circuits IF1 and IF2, test whether the influences of the protective resistor R1.1 are correct and whether there is any contact between the lines, e.g. with respect to the signal line L2. In the case of this procedure, it is possible while the operating switch SW1 is actuated in its first switch position "Apply" to replace the current device and accordingly also to switch off the current flow for a period of time.

The same procedure is performed with the signal line L2, wherein preferably the identical connection is not made or test voltages are not connected continuously at the same time to the signal lines L1 and L2.

While the operating switch SW1 is actuated into the second switch position "Release", it is likewise possible using control procedures that last for different periods of time to detect independence of the signal lines L1 and L2, in other words that the lines are not in contact. Even the leakage current that occurs when lower voltages are connected, e.g. 5V, 10V or, as illustrated in FIG. 1, 14V, renders it possible to differentiate between the two modes.

It is necessary to monitor that the vehicle electrical system voltage $U_{Batt}$ is properly connected to the operating switch SW1 in order to ensure that the control device ST1 is woken when required and in order not to draw any false conclusions from the levels of the signal lines L1 and L2 in the event of a short circuit of the vehicle electrical system voltage $U_{Batt}$, which is applied to the signal line L1, with respect, for example, to ground GND and with the control device running. In order to repeatedly prevent in a reliable manner a signal line L1 or L2 from short-circuiting with respect to the ground GND, said signal line being connected to the vehicle electrical system voltage $U_{Batt}$, additional resistance values that differ to the described test can be used in the interface circuits I1 and I2.

In place of the five lines as is known in the prior art, an operating switch SW1 of this type in accordance with FIG. 1 requires only three lines L1, L2 and L3 for connecting to the control device ST1 in order to render it possible to detect in a fault-tolerant manner with respect to individual faults the respective switching mode of the operating switch SW1 by means of the control device ST1, wherein two lines are signal lines, namely L1 and L2, and the third line L3 is used as an LED line of the light-emitting diode control and test support. The light-emitting diode LED could be omitted, but in this case the operating switch SW1 and the control device ST1 must then be connected by way of an additional line L3.

Exclusively normally open make-contact elements S1.1, S1.2, S2.1 and S2.2 are used for the operating switch SW1 as shown in FIG. 1, as a consequence of which costly toggle switches or the combination of normally open and normally closed make-contact elements are omitted. Thus, these switching contacts can be embodied as elastomer switching mats or space-saving resilient elements, such as leaf spring elements that produce the contact upon being actuated. Consequently, particularly simple and inexpensive switching contacts can be used.

Finally, simple components such as resistors and diodes are used for the operating switch SW1, which components ensure that the switching contacts are protected if, for example, the vehicle electrical system voltage $U_{Batt}$ is incorrectly applied to the switching contacts.

Figure 2:
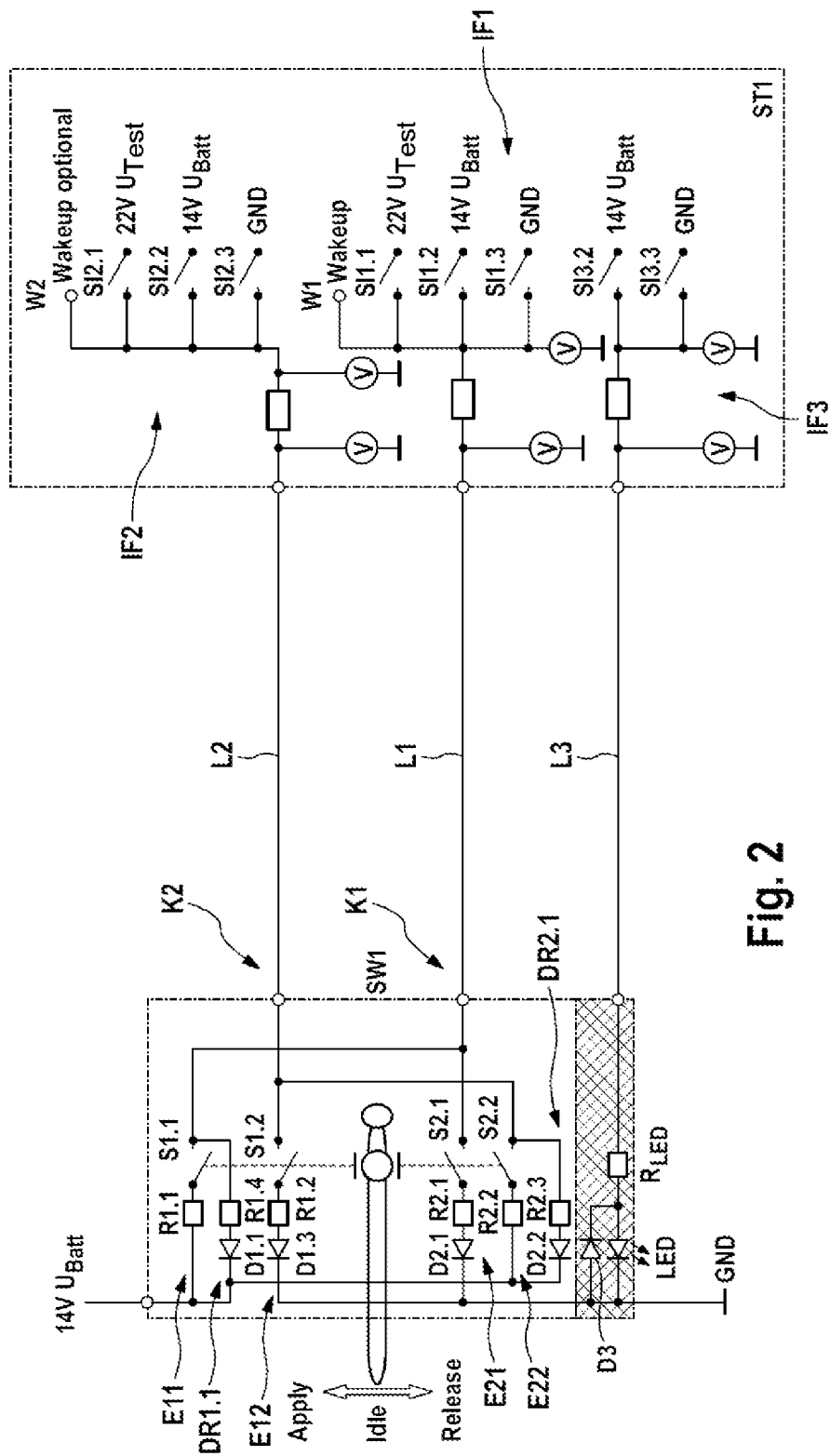
FIG. 2 shows a circuit arrangement as a further exemplary embodiment of the method in accordance with the invention comprising an operating switch having three switch positions and an LED display.

The circuit arrangement as shown in FIG. 2 differs from that shown in FIG. 1 by virtue of the fact that the parallel switch circuits E11 and E12 and accordingly E21 and E22 are connected differently in the first and second switch position respectively of the operating switch SW1. The interface circuits IF1, IF2 and IF3 of the control device ST1 do not differ from those shown in FIG. 1. The manner in which a light-emitting diode LED is connected to a protective resistor $R_{LED}$ and to a diode D3 that is connected in an anti-parallel manner with respect to the light-emitting diode LED for providing an alternative ground connection to the control device ST1 and its connection to same also remains unchanged in comparison to FIG. 1.

In accordance with FIG. 2, the contact branch K1 is embodied in an identical manner to that shown in FIG. 1. In contrast, the second switch circuit E12 is not connected in the first switch position of the operating switch SW1 to the vehicle electrical system voltage $U_{Batt}$ but rather to the reference potential, in other words to ground GND, in order to form the second contact branch K2. Accordingly, the second switch circuit E22 is not connected in the second switch position of the operating switch SW1 to the ground GND but rather to the vehicle electrical system voltage $U_{Batt}$.

In the case of this embodiment of the operating switch SW1, the wakeup function is only achieved once in the first switch position "Apply", since only the switch circuit E11 is connected to the vehicle electrical system voltage $U_{Batt}$. Since, however, the second switch circuit E22 is now connected in the second switch position of the operating switch SW1 to the positive potential of the vehicle electrical system voltage $U_{Batt}$, an optional wakeup function can be achieved in this switch position "Release". The particular aspect of this embodiment of the operating switch SW1 as shown in FIG. 2 is that the signal line L1 and L2 are influenced "in opposite directions" as the operating switch SW1 is actuated.

The test procedures that can be performed using this operating switch SW1 as shown in FIG. 2, in particular using the test voltage $U_{Test}$, which is greater than the magnitude of the vehicle electrical system voltage, correspond to those test procedures that have been discussed in conjunction with the circuit arrangement as shown in FIG. 1.

Figure 3:
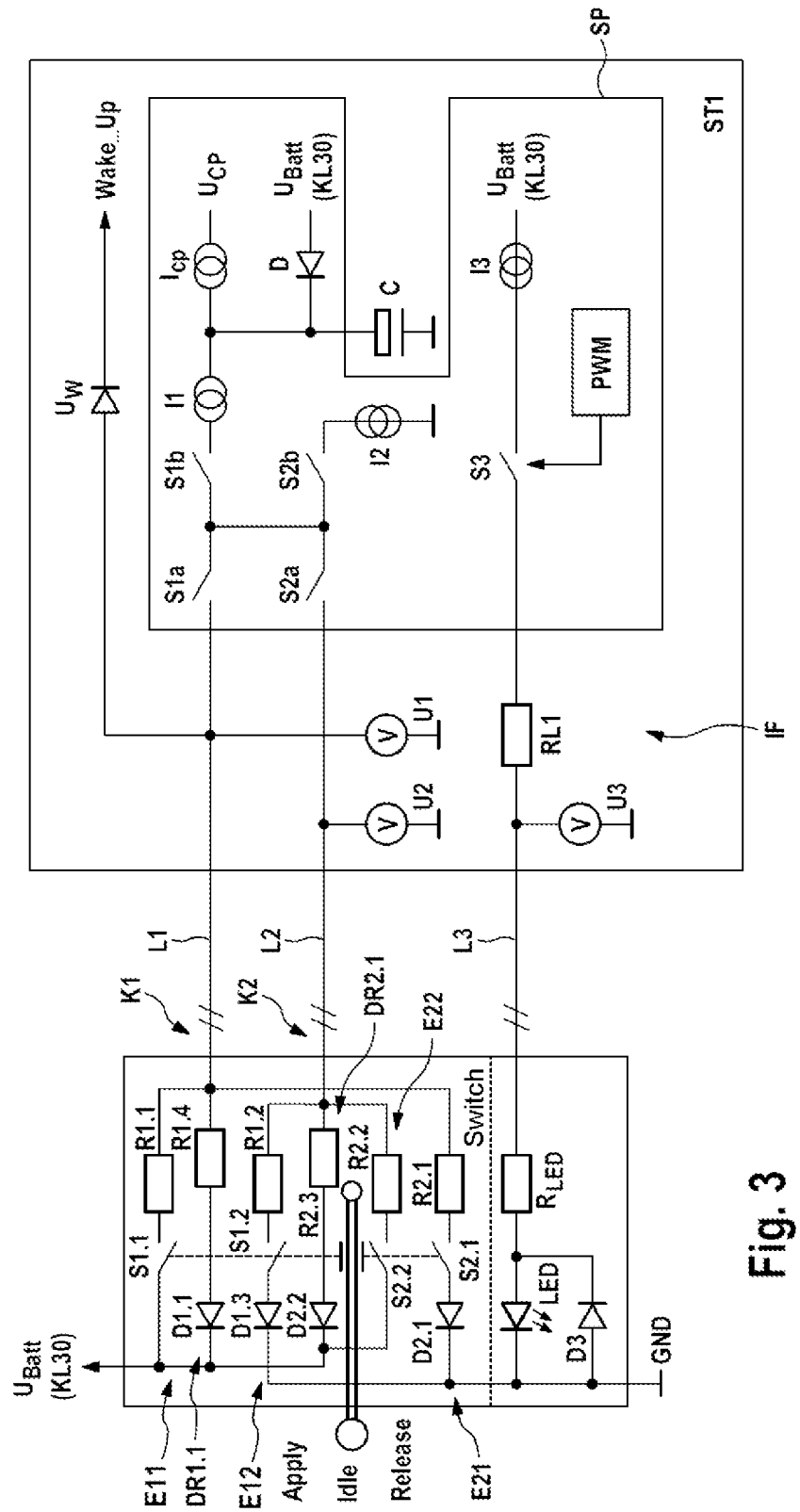
FIG. 3 shows a circuit arrangement in accordance with FIG. 2 with a schematic interface circuit of a control device.

The circuit arrangement as shown in FIG. 3 corresponds with respect to its structure to the arrangement shown in FIG. 2, in which the two signal paths K1 and K2 are connected "in opposite directions", however, it differs in the structure of the interface circuits I1, I2 and I3 of the control device ST1. The interface circuit IF shown in FIG. 3 comprises a voltage generating unit SP that is embodied with current sources.

The signal line L1 of the first contact branch K1 is connected to a voltage source $U_{CP}$, which represents the test voltage $U_{Test}$, by way of a series-connection of a switch S1a and S1b by way of series connected current sources I1 and $I_{cp}$. The connection line between the two current sources I1 and $I_{cp}$ is connected on the one hand to a capacitor C and on the other hand by way of a diode D, which is connected in the conducting direction, to the voltage electrical system voltage $U_{Batt}$ (KI30). The voltage level on the signal line L1 is determined by means of a measuring voltage U1.

The signal line L2 of the second contact branch K2 is connected by way of two series-connected switches S2a and S2b to a current source I2. The respective series-connected switches S1a and S1b and accordingly S2a and S2b are mutually connected. The voltage level on the signal line L2 is determined by means of a measuring voltage U2.

The LED line L3 is connected to the voltage electrical system voltage $U_{Batt}$ (KI30) by way of a resistor RL1, a switch S3 and a current source I3, wherein the switch S3 for controlling the light-emitting diode LED of the operating switch SW1 is connected to a circuit for pulse width modulation.

The test procedures that are performed by the control device ST1 in order to detect faults and monitor the functions for all switch positions of the operating switch SW1, in other words for the neutral position, the first switch position "Apply" and the second switch position "Release" is illustrated in the tables in accordance with the FIGS. 4a, 4b and 4c.

By way of example, the cases are described in these tables, in which a test is performed as shown in FIG. 3 using a test voltage $U_{Test}$ or $U_{cp}$ to determine if the operating switch SW1 is detached.

The table shown in FIG. 4a illustrates the test procedures if the operating switch SW1 is in the non-actuated mode, in other words is located in its neutral position. Two procedures are available for detecting that the operating switch SW1 is detached from the connection of the vehicle electrical system voltage $U_{Batt}$ (corresponds in the FIGS. 4a, 4b and 4c to $U_b = U_{Batt}$), in other words is detached from the clamp 30. (cf. lines 4 and 5.)

In accordance with the first test, the switches S1a and S1b are closed, whereas the two switches S2a and S2b remain open, wherein the switch S3 can assume any position. In this case, the test voltage $U_{cp}$ is applied to the signal line L1, so that when the connection to the first switch circuit E11 is intact, the potential on the signal line L1 is between the vehicle electrical system voltage $U_{Batt}$ and the test voltage $U_{cp}$, since the diode device DR1.1 provides a connection to the vehicle electrical system voltage $U_{Batt}$, which connection bridges the switching contact S1.1.

Consequently, $U_{Batt}<U1<U_{cp}$ applies. In contrast, the measuring voltage U2 at the signal line L2 is zero, since the switching contact S1.2 is open and likewise the two switches S2a and S2b are open.

In the event of a fault, in other words a detached connection to the vehicle electrical system voltage $U_{Batt}$, there would no longer be a connection to the clamp 30 and therefore the potential on the signal line L1 would be at the level of the test signal $U_{cp}$.

In accordance with the second test, the two switches S1b and S2a are closed, whereas the two other switches S1a and S2b remain open. As a consequence, the test voltage $U_{cp}$ is applied to the signal line L2, so that as in the first described case as a result of the connection of the diode device DR2.1 of the first switch circuit of the second switch position of the operating switch SW1 a connection to the vehicle electrical system voltage $U_{Batt}$ is produced and consequently $U_{Batt}<U2<U_{cp}$ applies for the level on the signal line L2.

In contrast, the measuring voltage U1 on the signal line L1 is zero, since the switching contact S1.1 is open and likewise the two switches S1a and S1b are open.

If the operating switch SW1 is in its first switch position "Apply", then a detachment from the vehicle electrical system voltage $U_{Batt}$ is tested in accordance with the table as shown in FIG. 4b (cf. line 5) by virtue of the fact that the switches S1a and S1b are closed, whereas the two other switches S2a and S2b are open. The switch S3 can be in any switch position. If the connection to the vehicle electrical system voltage $U_{Batt}$ is detached, the level on the signal line L1 adjusts to the test voltage $U_{cp}$, $U1=U_{cp}$ applies. The measuring voltage U2 has the value zero.

Accordingly, it is also possible in the second switch position "Release" of the operating switch SW1 to detect a detachment from the vehicle electrical system voltage $U_{Batt}$ in accordance with the table as shown in FIG. 4c. (cf. line 5). For this purpose, the switches S1b and S2a are closed, whereas the two other switches S1a and S2b remain open, so that the test voltage $U_{cp}$ is only applied to the signal line L2. Since the signal line L2 is not connected to the clamp 30, the level on this line L2 adjusts to the test voltage $U_{cp}$, $U2=U_{cp}$ applies. The measuring voltage U1 has the value zero.

Figure 5:
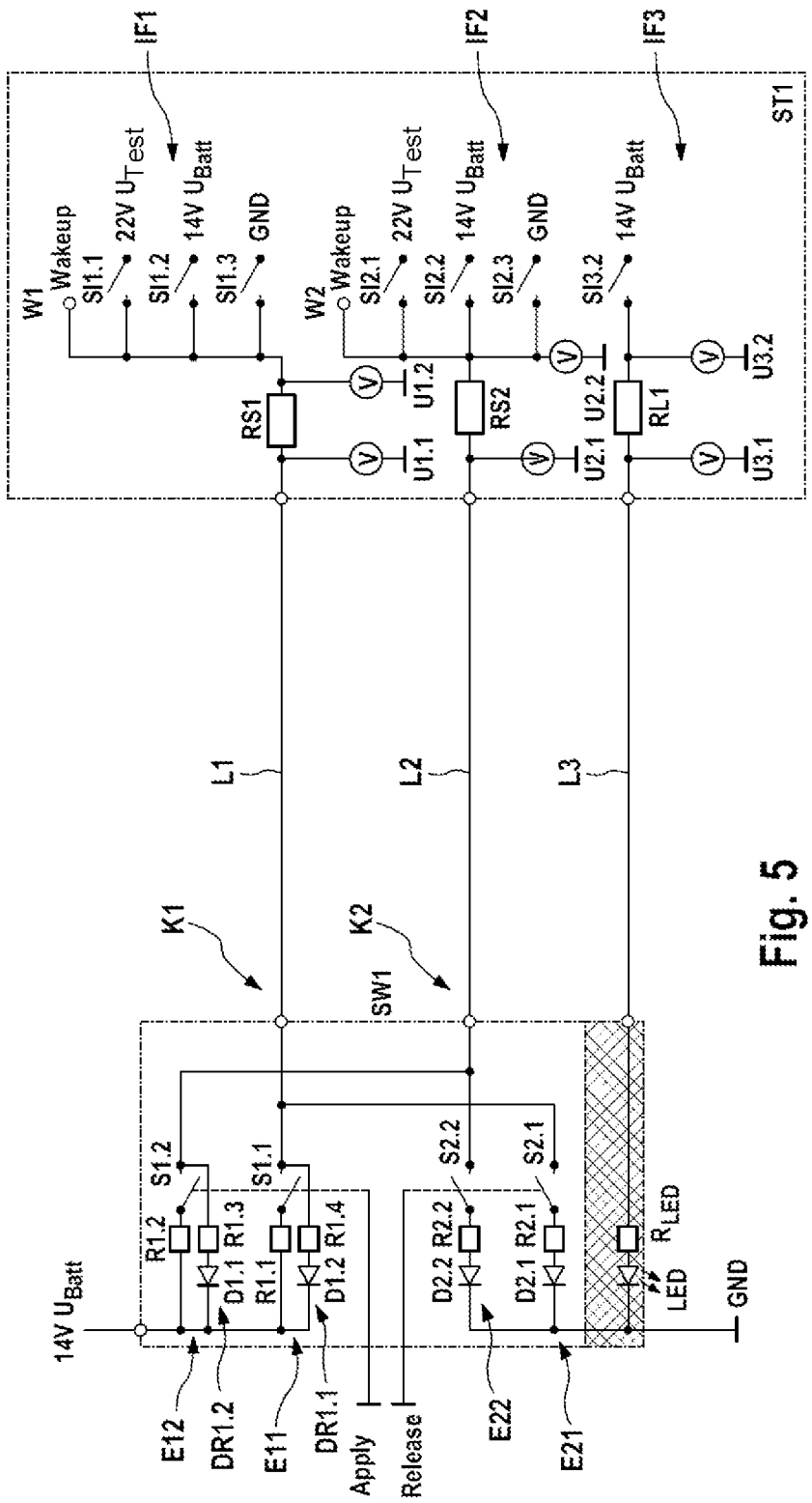
FIG. 5 shows a circuit arrangement as a further exemplary embodiment of the method in accordance with the invention comprising an operating switch that is not provided with a mechanical locking arrangement.

The circuit arrangement as shown in FIG. 5 illustrates an operating switch SW1 as a parking brake switch that is embodied in its first and second switch position corresponding to the operating switch SW1 as shown in FIG. 1 in each case with two switch circuits E11 and E12 and accordingly E21 and E22, but, in contrast to FIG. 1, it does not comprise any locking arrangement and is embodied with two switch keys.

Moreover, there is no diode D3 for producing a GND connection by way of the control device ST1 if the ground connection of the operating switch SW1 became detached.

The test procedures correspond to those as described in conjunction with FIG. 1.

Figure 6:
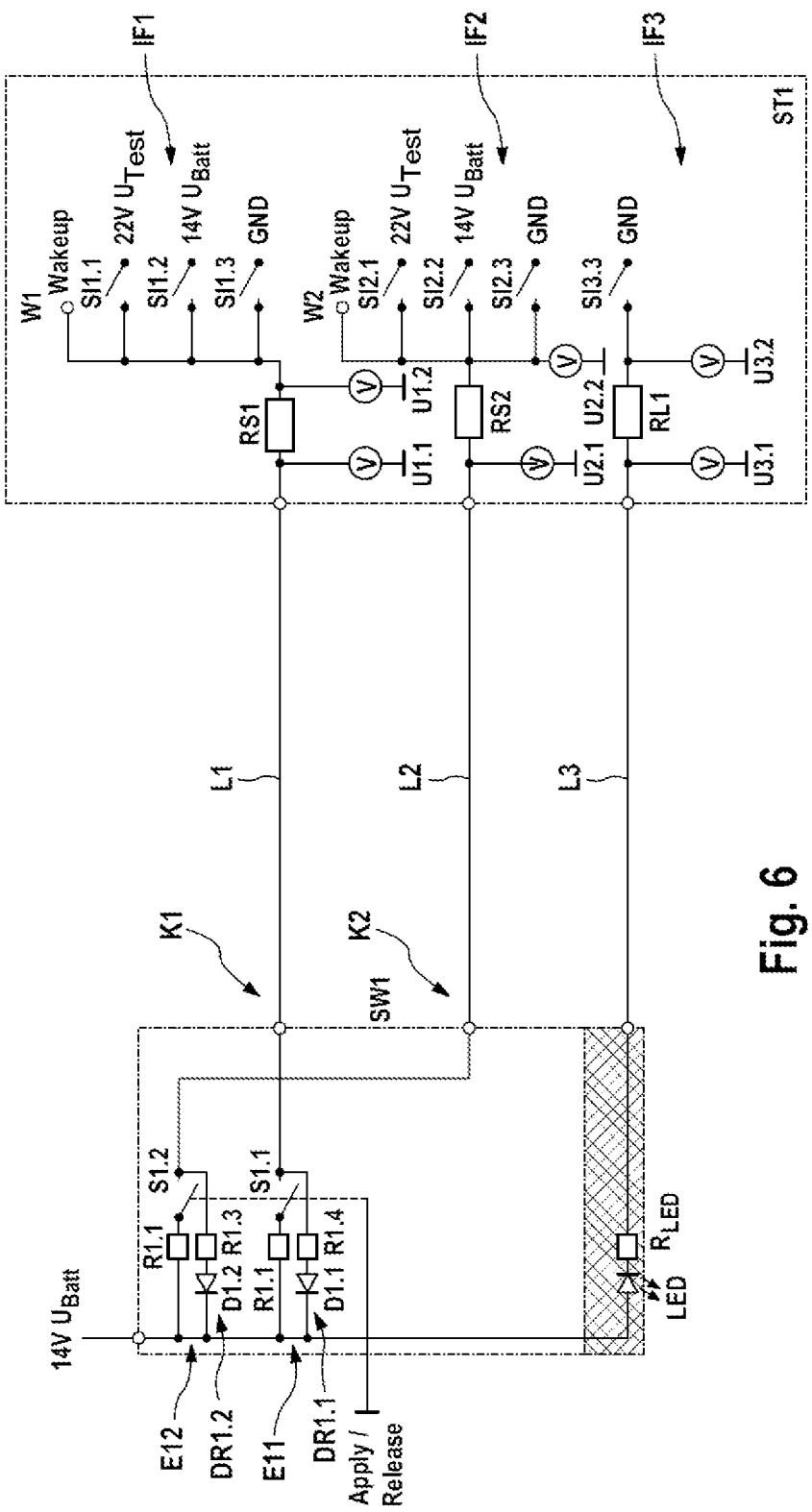
FIG. 6 shows a circuit arrangement as a further exemplary embodiment of the method in accordance with the invention comprising an operating switch as a switch key having an LED display.

The circuit arrangement as shown in FIG. 6 illustrates an operating switch SW1 as a parking brake key switch that is embodied only from a key switch having a first switch position as the sole switch position, wherein this sole switch position comprises two parallel switch circuits E11 and E12 that corresponding to the switch circuits E11 and E12 of the operating switch SW1, as shown in FIG. 1, are connected by way of signal lines L1 and L2 to a control device ST1 in order to form a first contact branch K1 and K2. The non-actuated mode of this key switch SW1 corresponds to the neutral position of the operating switch SW1 as shown in FIG. 1.

This operating switch SW1 is also embodied with a light-emitting diode LED and a protective resistor $R_{LED}$, connected at one end to the vehicle electrical system voltage $U_{Batt}$ and at the other end can be connected by way of an LED line L3 and the interface circuit 13 to the reference potential of the vehicle electrical system voltage $U_{Batt}$, in other words to ground GND.

The test procedures, in particular with a test voltage $U_{Test}$, are described in an identical manner corresponding to those in conjunction with FIG. 1.

The circuit arrangement as shown in FIG. 7 illustrates a simple operating switch SW2 without redundant switch circuits, it therefore comprises only one switch circuit E1 that is connected to the vehicle electrical system voltage $U_{Batt}$, which switch circuit is connected by way of a signal line L1 to a control device ST2 that comprises only a sole interface circuit IF1 that corresponds to the interface IF1 in accordance with the control device ST1 as shown in FIG. 1.

The sole switch circuit E1 comprises a switching contact S1 that is bridged by a diode device DR1 and consequently corresponds to the diode device DR1.1 described in FIG. 1, in other words it comprises a series-connection of a diode D1 and a resistor R1, wherein the diode D1 is connected in the non-conducting direction with respect to the vehicle electrical system voltage $U_{Batt}$.

This simple operating switch SW2 provides a leakage current-free switch input, the wire connection of which to the vehicle electrical system voltage $U_{Batt}$ can be tested likewise as in the case of the operating switch SW1 as shown in FIG. 1 using a test voltage $U_{Test}$, the magnitude of which is greater than the magnitude of the vehicle electrical system voltage $U_{Batt}$. The signal generated by this operating switch SW2 is capable of the wakeup function.

FIG. 8 illustrates an operating switch SE3 that likewise corresponds to the operating switch SW2 as shown in FIG. 7, however, this operating switch SW3, in contrast to the operating switch SW2 as shown in FIG. 7, comprises a resistor R2 that is connected in series to the switching contact S1 and a diode D2 that is poled in the conducting direction. As a result of this additional connection to the resistor R2 and the diode D2, it is possible to perform a test by means of the control device ST3, with which a short circuit of the signal line L1 with respect to the vehicle electrical system voltage $U_{Batt}$ is detected.

Figure 9:
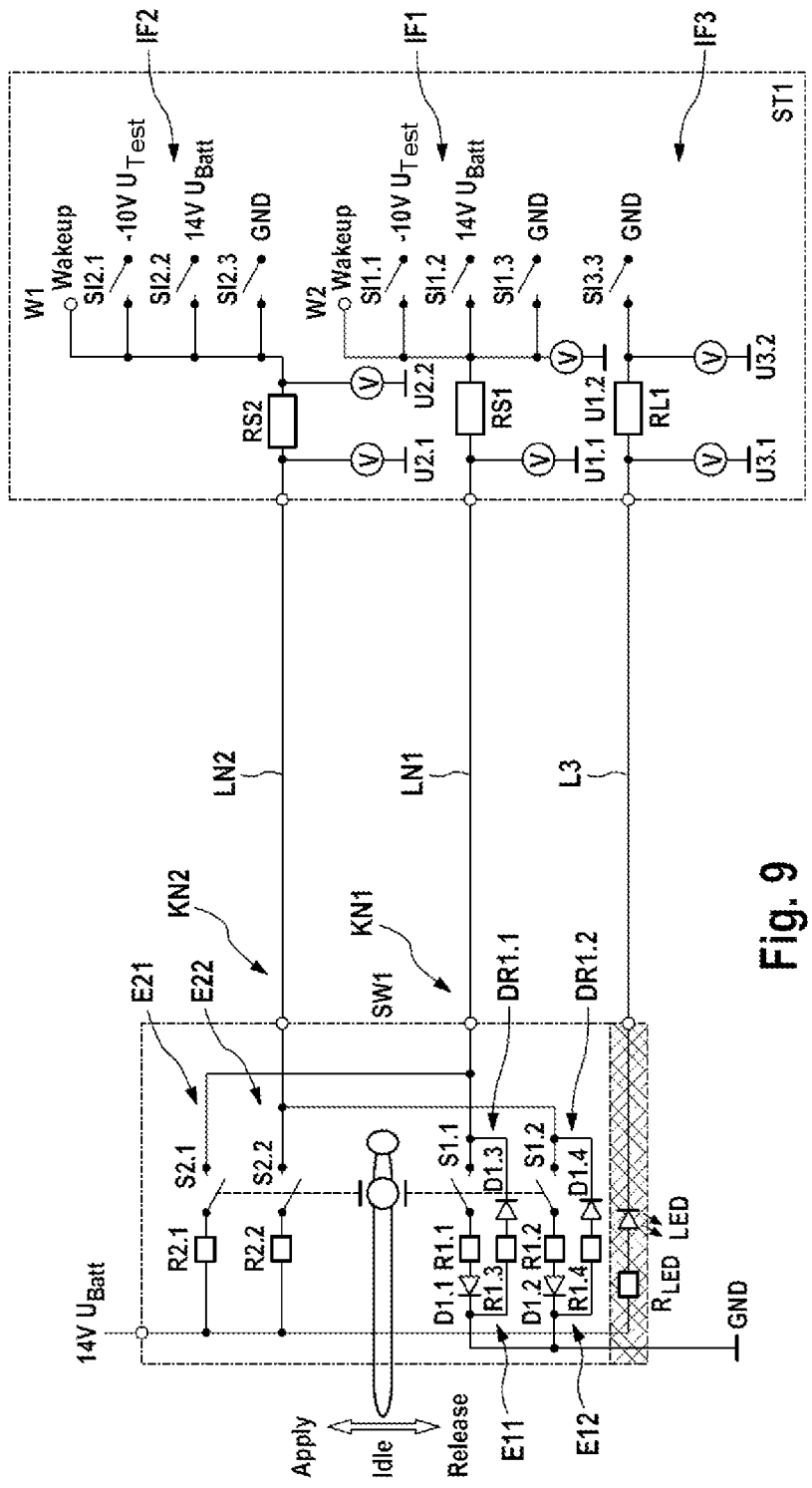
FIG. 9 shows a circuit arrangement as a further exemplary embodiment of the method in accordance with the invention, wherein a fault of the operating switch is detected using a test voltage that is negative with respect to the reference voltage (GND)

The circuit arrangement as shown in FIG. 9 illustrates with respect to the arrangement shown in FIG. 1 an alternative embodiment with respect to the test voltage $U_{Test}$, the magnitude of which is not greater than the magnitude of the positive potential of the vehicle electrical system voltage $U_{Batt}$, but rather is negative with respect to the reference voltage of the vehicle electrical system voltage $U_{Batt}$, in other words with respect to the ground GND, and does not amount, for example as in the other exemplary embodiments, to +22V but rather amounts for example to −10V. This produces a different structure within the operating switch SW1, as illustrated in FIG. 9.

This operating switch SW1 as shown in FIG. 9 likewise comprises two switch positions "Apply" and "Release" and also a neutral position, wherein two switch positions are embodied in each case with redundant switch circuits E11 and E12 and accordingly E21 and E22.

The "Release" position is described in conjunction with the description relating to FIG. 9 as the first switch position and the "Apply" position is described as the second switch position of the operating switch SW1.

The operating switch SW1 as the parking brake switch is connected by way of two signal lines LN1 and LN2 and also an LED line L3 to a control device for example a parking brake control device as an evaluating unit ST1. These lines LN1, LN2 and L3 are connected to the control device ST1 in each case by way of an interface circuit IF1, IF2 and IF3 corresponding to that shown in FIG. 1 with the difference that the test voltage $U_{Test}$ is negative and the LED line L3 can be connected by way of a switch SI3.3 only to the ground GND of the vehicle electrical system voltage $U_{Batt}$.

Each of the switch circuits E11 and E12 and accordingly E21 and E22 of the operating switch SW1 comprises a contact element S1.1 and S1.2 and accordingly S2.1 and S2.2 as a switching contact, with which in each case a protective resistor R1.1 and R1.2 and accordingly R2.1 and R2.2 is connected in series. Furthermore, a diode D1.1 and D1.2 is connected in each case in the conducting direction in series to the resistors R1.1 and R1.2 of the two switch circuits E11 and E12 in the first switch position.

The two switch circuits E11 and E12 in the first switch position "Release" are connected at one end to the reference potential GND of the vehicle electric system voltage $U_{Batt}$, in other words are connected to ground GND, and at the other end the switch circuit E11 and E12 respectively is connected to the signal line LN1 and LN2 respectively to form a first and accordingly a second contact branch KN1 and KN2 respectively, which signal lines for their part are connected to the interface circuit IF1 and IF2 respectively of the control device ST1.

Furthermore, these two switch circuits E11 and E12 are bridged in each case by a diode device DR1.1 and DR1.2 respectively, said diode device being embodied from a series-connected diode D1.3 and R1.3 and accordingly D1.4 and R1.4, wherein the two diodes D1.3 and D1.4 are polarized in each case in the non-conducting direction with respect to the vehicle electric system voltage $U_{Batt}$.

The two switch circuits E21 and E22 of the second switch position "Apply" are connected at one end to the positive potential of the vehicle electric system voltage $U_{Batt}$, and at the other end to the first and accordingly second contact branch KN1 and KN2 respectively and are connected at this site to the first and accordingly second switch circuit E11 and E22 respectively.

Furthermore, the operating switch SW1 comprises a light-emitting diode LED that is connected by way of the LED line L3 to the interface circuit IF3 of the control device ST1 and is controlled by said control device to display the mode of the function that can be actuated using the operating switch (in other words the parking brake is applied or released). This light-emitting diode LED is connected directly by way of a protective resistor $R_{LED}$ to the vehicle electrical system voltage $U_{Batt}$.

The procedure of testing the function of the operating switch SW1 as shown in FIG. 9 and also the procedure of detecting the switch positions are performed in an identical manner to that as described in conjunction with the circuit arrangement as shown in FIG. 1, in other words by systematically querying and accordingly connecting different voltages (or currents) and evaluating the effects by way of the voltage drop at the resistors RS1, RS2 and accordingly RS3 of the interface circuits IF1, IF2 and IF3.

The signal lines LN1 and LN2 are connected for short periods of time using different test voltages or test currents, wherein for this purpose also the test voltage $U_{Test}$ used as the test voltage is of the magnitude, as already mentioned, that is negative with respect to the reference potential GND of the vehicle electrical system voltage $U_{Batt}$, in other words is the ground, in order thereby likewise to detect, for example, a detachment of the operating switch SW1 from the positive potential of the vehicle electrical system voltage $U_{Batt}$.

Figure 10:
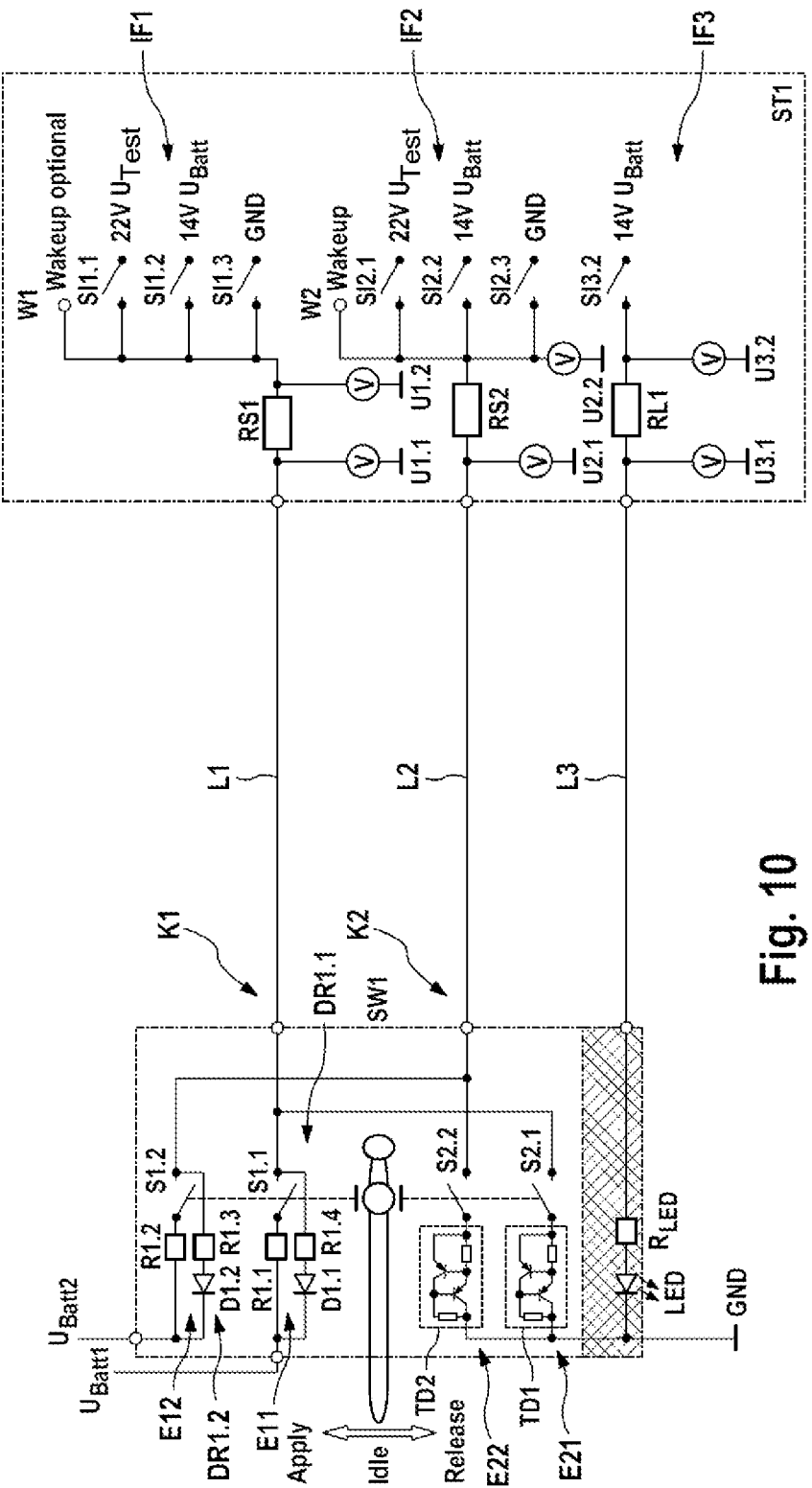
FIG. 10 shows a circuit arrangement as a further exemplary embodiment of the method in accordance with the invention comprising an operating switch having a redundant vehicle electric system voltage.

The circuit arrangement as shown in FIG. 10 is, in principle, identical to that as shown in FIG. 1, however, with the differences that two supply voltages are provided for the operating switch SW1 and the switch circuits E21 and E22 are used in the second switch position in place of the diodes D2.1 and D2.2 diode equivalent circuits TD1 and TD2. These diode equivalent circuits TD1 and TD2 are embodied with two transistors and two resistors in the manner known to the person skilled in the art. It is also possible to replace the diodes in the operating switch SW1 illustrated in the other figures completely or in parts by diode equivalent circuits of this type.

Moreover, in the case of the operating switch SW1 as shown in FIG. 10, there is no diode D3 connected in an anti-parallel manner with respect to the light-emitting diode LED for a replacement of a GND connection.

In the case of this operating switch SW1 as shown in FIG. 10, the first switching branch E11 is connected to a first vehicle electrical system voltage $U_{Batt1}$ and the second switching branch E12 is connected to a second vehicle electrical system voltage $U_{Batt2}$.

This type of redundant voltage supply to the operating switch SW1 improves the availability of said operating switch. Each of these vehicle electrical system voltages $U_{Batt1}$ and $U_{Batt2}$ is tested separately to detect a detachment from the operating switch SW1 using the test voltage $U_{Test}$ that is applied in each case to the signal line L1 and L2, as is described in conjunction with the circuit arrangement as shown in FIG. 1. A redundant voltage supply of this type can also be achieved in the other circuit arrangements that are described.

Figure 11:
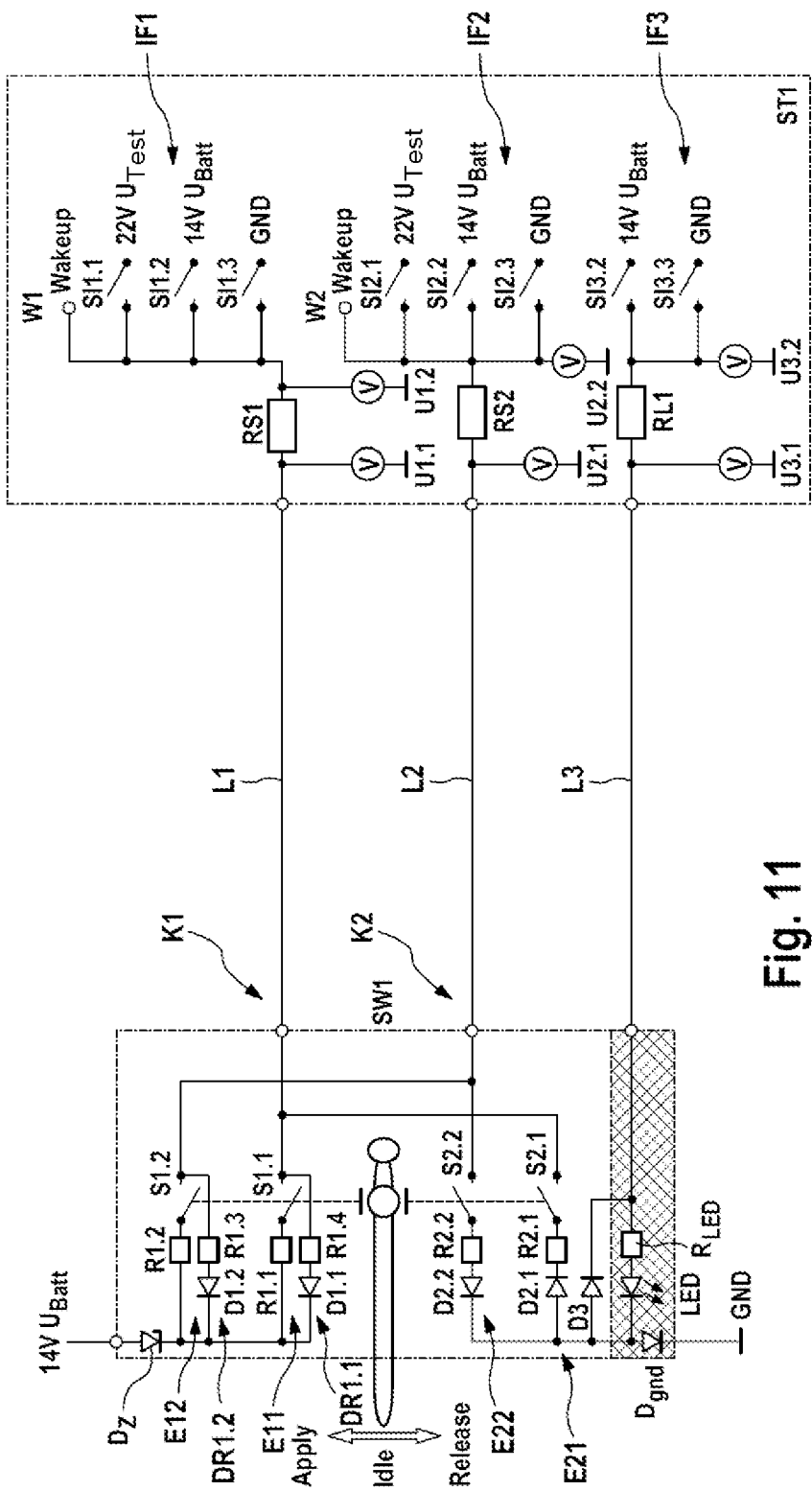
FIG. 11 shows a circuit arrangement as a further exemplary embodiment of the method in accordance with the invention comprising an operating switch having a double ground supply.

The circuit arrangement as shown in FIG. 11 is, in principle, identical to that shown in FIG. 1, the operating switch SW1, however, comprises a Zener diode $D_Z$ in the supply line of the vehicle electrical system voltage $U_{Batt}$ for the two switch circuits E11 and E12 of the first switch position "Apply" (and a diode $D_{gnd}$ that is connected in the connecting line to the ground GND), which renders it possible in the case of a short circuit of the vehicle electrical system voltage $U_{Batt}$ with respect to the ground GND to ensure an internal voltage supply of the operating switch SW1 by way of the respective other signal line L1 or L2 and simultaneously also to perform the tests on the operating switch SW1, above all using the test voltage $U_{Test}$. The latter mentioned procedure is possible by virtue of the fact that the magnitude of the test voltage $U_{Test}$ is greater that the Zener voltage $U_Z$ of this Zener diode D.

Moreover, a double ground supply is ensured with this operating switch SW1 as shown in FIG. 11, namely once by way of the connection of the ground GND at the operating switch SW1 and on the other hand in addition by way of the LED line L3 that can be connected by means of the switch SI3.3 of the interface circuit IF3 of the control device ST1.

The procedure of testing the function of the operating switch SW1 as shown in FIG. 11 and also the procedure of detecting the switch positions are performed in an identical manner to that as described in conjunction with the circuit arrangement as shown in FIG. 1, in other words by systematically querying and accordingly connecting different voltages (or currents) and evaluating the effects by way of the voltage drop at the resistors RS1, RS2 and accordingly RS3 of the interface circuits IF1, IF2 and IF3.

Figure 12:
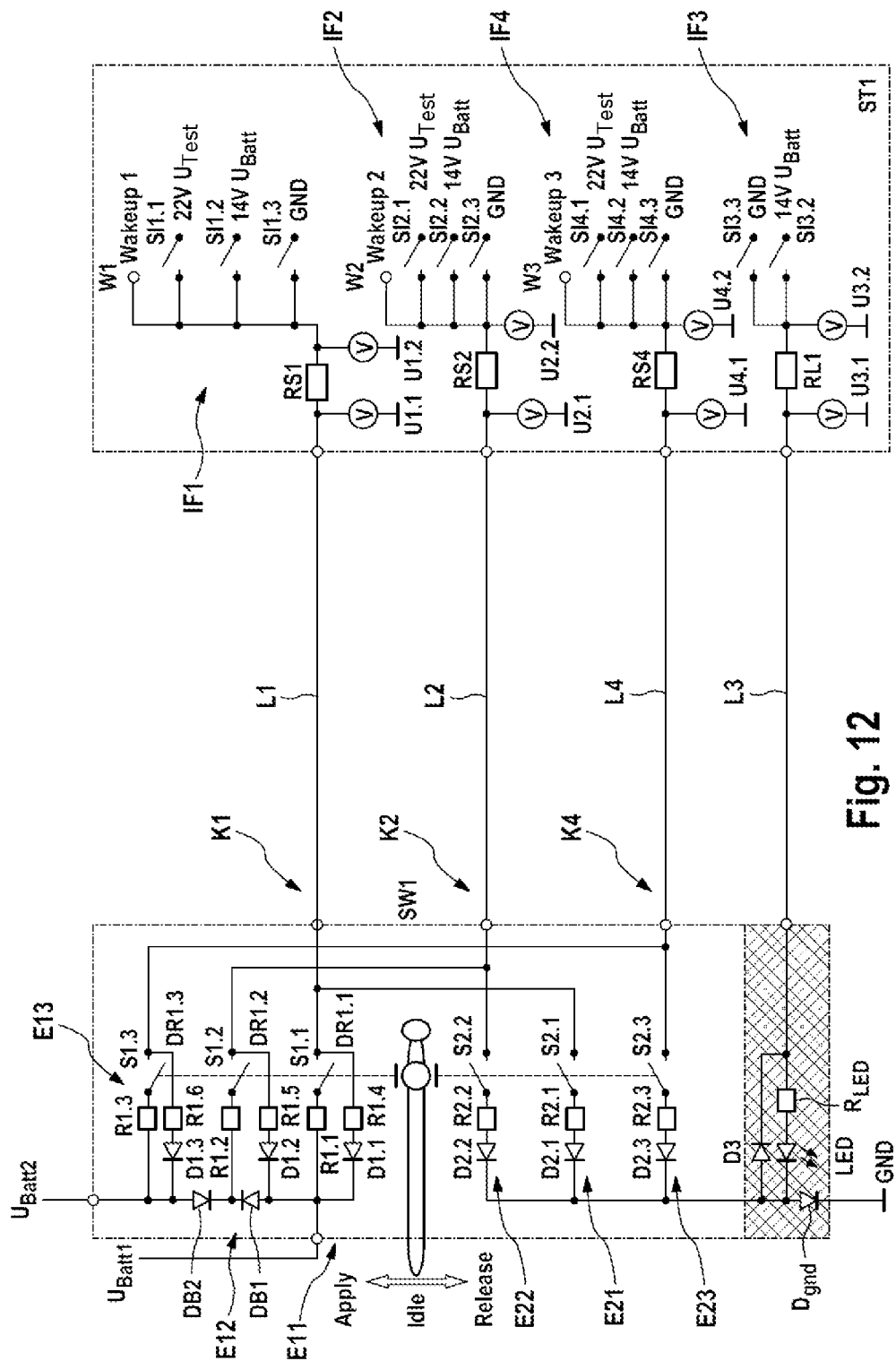
FIG. 12 shows a circuit arrangement as a further exemplary embodiment of the method in accordance with the invention comprising an operating switch having threefold redundant switch circuits in the switch positions.

The circuit arrangement as shown in FIG. 12 illustrates an operating switch SW1 that comprises threefold redundant switch circuits in the two switch positions "Apply" and "Release" and therefore comprises in comparison to the circuit arrangement as shown in FIG. 1 three signal lines L1, L2 and L4 that are connected by way of likewise three interface circuits IF1, IF2 and IF4 to a control device ST1. An LED line L3 connects an interface circuit IF3 to a light-emitting diode LED of the operating switch SW1.

In principle, the structure of this circuit arrangement as shown in FIG. 12 corresponds to that shown in FIG. 1. Thus, in relation to the operating switch SW1, the switch circuits E11, E12 and E13 in the first switch position are embodied in each case with a diode device DR1.1, DR1.2 and DR1.3 and likewise the switch circuits E21, E22 and E23 of the second switch position as those of the operating switch SW1 as shown in FIG. 1.

Two vehicle electrical system voltages $U_{Batt1}$ and $U_{Batt2}$ are provided for the voltage supply of the operating switch SW1, wherein the switch circuits E11 and E12 are connected to the first vehicle electrical system voltage $U_{Batt1}$ and the switch circuit E13 is connected to the second vehicle electrical system voltage $U_{Batt2}$. The diodes DB1 and DB2 are used to delimit the two vehicle electrical system voltages $U_{Batt1}$ and $U_{Batt2}$ with respect to each other.

The switch circuits E21, E22 and E23 of the second switch position are connected by interpositioning a diode $D_{gnd}$ to the reference potential GND of the vehicle electrical system voltages $U_{Batt}$. It is also possible to provide an optional additional connection of the ground GND by way of the diode D3, the LED line L3 and the interface circuit IF3.

The threefold redundant embodiment of the operating switch SW1 as shown in FIG. 12 renders it possible in the case of simple faults in the voltage supply, in other words, for example, a detachment of the clamp 30 or a detachment of the ground GND, still to detect in a reliable manner the switch position of the operating switch SW1. This also applies in the case of short circuits between the signal line L1, L2 and L4.

The interface circuits IF1, IF2, IF3 and IF4 correspond in their structure and their function to that shown in FIG. 1.

Figure 13:
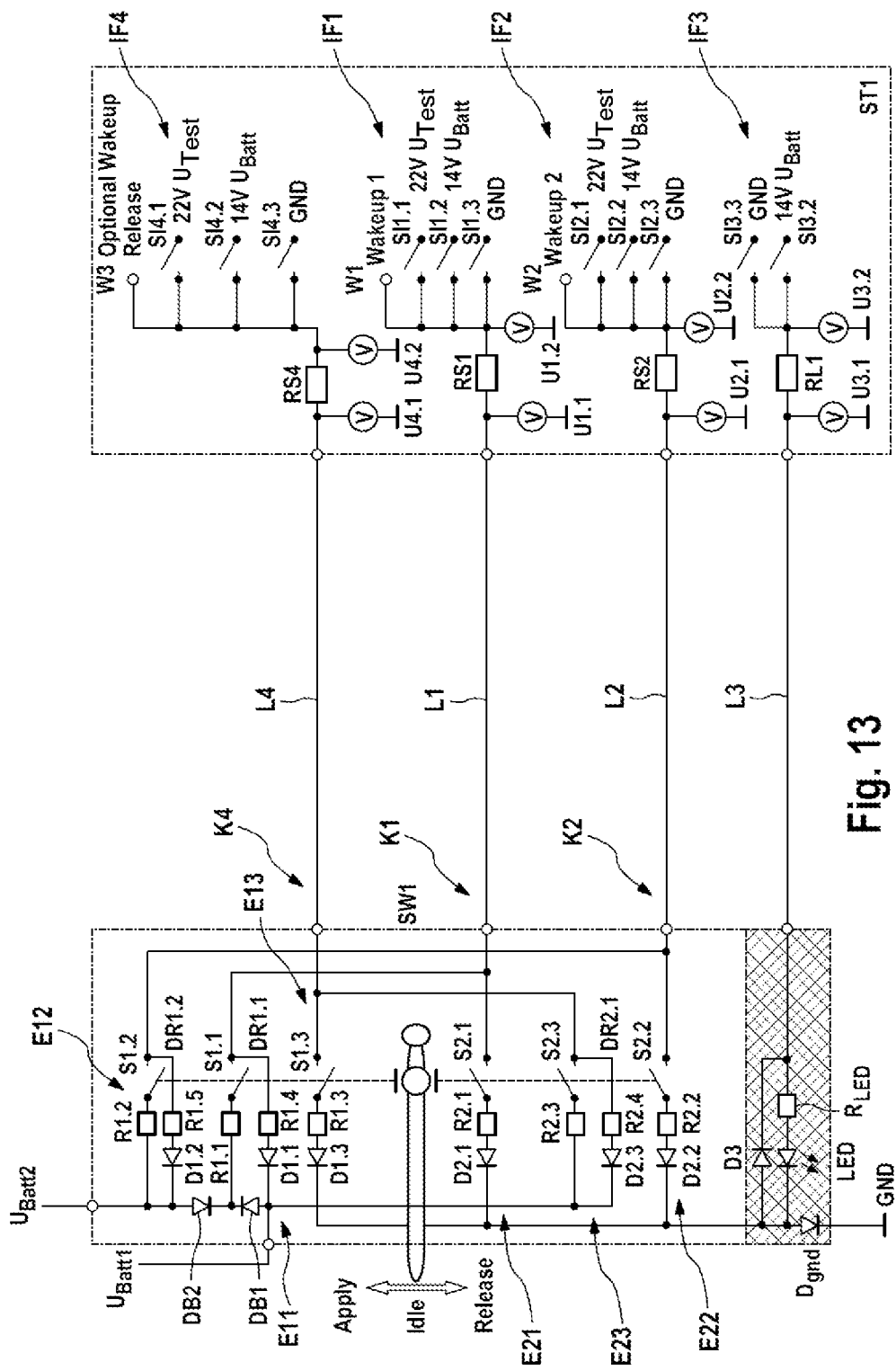
FIG. 13 shows a circuit arrangement as a further exemplary embodiment of the method in accordance with the invention comprising an operating switch having threefold redundant switch circuits in the switch positions.

The circuit arrangement as shown in FIG. 13 illustrates an alternative embodiment to that shown in FIG. 12, wherein the operating switch SW1 in the arrangement shown in FIG. 13 is likewise embodied with threefold redundant switch circuits in the two switch positions "Apply" and "Release", and corresponding to the operating switch SW1 as shown in FIG. 2 a signal path "functioning in the opposite direction" is provided as a third contact branch K3.

Thus, the first switch circuit E11 and the second switch circuit E12 in the first switch position "Apply" corresponding to FIG. 12 is connected to a first and second vehicle electrical system voltage $U_{Batt1}$ and $U_{Batt2}$, whereas the third switch circuit E13 is connected to the reference potential GND. As a consequence, the third switch circuit E23 of the second switch position "Release" is supplied by the first vehicle electrical system voltage $U_{Batt1}$, which third switch circuit is connected to the third switch circuit E13.

The test functions and also the mode of functioning and advantages correspond to the circuit arrangement as shown in FIG. 12.

Figure 14:
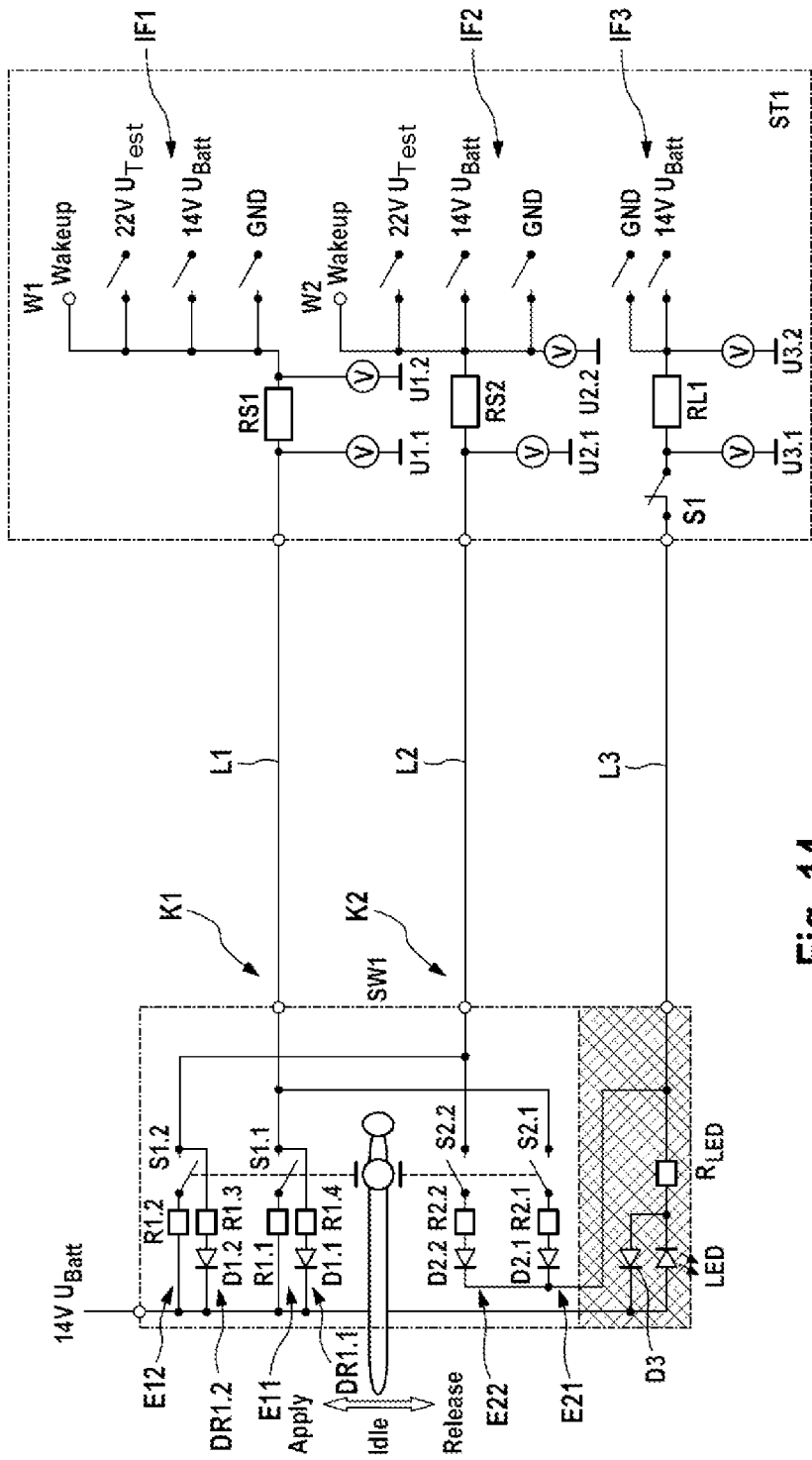
FIG. 14 shows a circuit arrangement as a further exemplary embodiment of the method in accordance with the invention comprising an operating switch that is not provided with a ground connection.

Finally, the circuit arrangement as shown in FIG. 14 comprises an alternative embodiment to that shown in FIG. 1, wherein the operating switch SW1 does not have a connection to ground GND. The ground GND is supplied when necessary by way of the diode D3 that is connected in an antiparallel manner with respect to the light-emitting diode LED, the LED line L3 and the interface circuit IF3. Therefore, the switch circuits E21 and E22 of the second switch position of the operating switch SW1 are also connected to this LED line L3.

A switch S1 of the interface circuit IF3 is used to switch off the leakage current.

It is also possible to use current sources in place of the voltage sources in the control devices. The test voltage $U_{Batt}$ is generated using generally known charging pumps, bootstrap circuits or DC/DC converters, wherein the latter mentioned are also used to reduce voltages to lower test voltages.

While the above description constitutes the preferred embodiment of the present invention, it will be appreciated that the invention is susceptible to modification, variation and change without departing from the proper scope and fair meaning of the accompanying claims.

The invention claimed is:

1. A method for detecting a fault of an operating switch (SW1, SW2, SW3) that is connected to an evaluating unit (ST1) by means of at least one signal line (L1, LN1) comprises providing at least a first switch circuit (E1, E11) for initiating a vehicle function of a vehicle, wherein a signal that specifies a position of the switch for initiating the vehicle function is sensed and evaluated by the evaluating unit (ST1)
   connecting the first switch circuit (E1, E11) at one end to a first potential of the vehicle electrical system voltage ($U_{Batt}$) of the vehicle and connecting at the other end to a first of the at least one signal line (L1, LN1) in order to form a first contact branch (K1) in a first position of the switch,
   bridging the first switch circuit (E1, E11) by a first diode device (DR1, DR1.1) in the non-conducting direction with respect to the first potential of the vehicle electrical system voltage ($U_{Batt}$),
   the evaluating unit (ST1) generating a test voltage ($U_{Test}$), the magnitude of which is greater than the first potential,
   applying the test voltage ($U_{Test}$) to the first signal line (L1) of the first contact branch (K1), and,
   evaluating the potential that is being applied to the first signal line (L1) of the first contact branch (K1) by means of the evaluating unit (ST1) in order to detect the fault.

2. The method as claimed in claim 1, further comprising in that:
   the operating switch (SW1) in the first switch position is embodied with a second parallel switch circuit (E12),
   the second switch circuit (E12) is bridged by a second diode device (DR1.2) in the non-conducting direction with respect to the first potential of the vehicle electrical system voltage ($B_{att}$), and
   in order to form a second contact branch (K2) the second switch circuit can be connected by way of a second of the at least one signal line (L2, LN2) to the evaluating unit (ST1).

3. The method as claimed in claim 2, further comprising in that:
   the operating switch (SW1) in the first switch position is embodied with a third parallel switch circuit (E13),
   the third switch circuit (E13) is bridged by a third diode device (DR1.3) in the non-conducting direction with respect to the first potential of the vehicle electrical system voltage ($B_{att}$), and
   in order to form a third contact branch (K3) the third switch circuit (E13) can be connected by way of a third of the at least one signal line (L3) to the evaluating unit (ST1).

4. The method as claimed in claim 3, further comprising in that:

the third contact branch (K3) is connected to the first potential of the vehicle electrical system voltage ($U_{Batt}$)

the test voltage ($U_{Test}$) is applied to the third signal line (L3) of the third contact branch (K3), and, the potential that is being applied to the third signal line (L3) of the third contact branch (K3) is evaluated by means of the evaluating unit (ST1) in order to detect the fault.

5. The method as claimed in claim 4, further comprising in that:

the operating switch (SW1) can be actuated into a second switch position having a first and thereto parallel second and third switch circuit (E21, E22, E23), and the first, second and third switch circuit (E21, E22, E23) are connected on the one hand to the second potential of the vehicle electrical system voltage ($U_{Batt}$) and on the other hand the first switch circuit (E21) is connected to the first contact branch (K1), the second switch circuit (E22) is connected to the second contact branch (K2) and the third switch circuit (E23) is connected to the third contact branch (K3).

6. The method as claimed in claim 3, further comprising in that:

the third contact branch (K3) is connected to the second potential of the vehicle electrical system voltage ($U_{Batt}$) of the vehicle, the test voltage ($U_{Test}$) is applied to the second signal line (L2) of the second contact branch (K2), and, the potential that is being applied to the second signal line (L2) of the first contact branch (K2) is evaluated by means of the evaluating unit (ST1) in order to detect the fault.

7. The method as claimed in claim 2, further comprising in that:

the second contact branch (K2) is connected to the first potential of the vehicle electrical system voltage ($U_{Batt}$) of the vehicle, the test voltage ($U_{Test}$) is applied to the second signal line (L2) of the second contact branch (K2), and, the potential that is being applied to the second signal line (L2) of the second contact branch (K2) is evaluated by means of the evaluating unit (ST1) in order to detect the fault.

8. The method as claimed in claim 7, further comprising in that:

the operating switch (SW1) can be actuated into a second switch position having a second and thereto parallel third switch circuit (E21, E22), and the second and third switch circuit (E21, E22) are connected on the one hand to a second potential of the vehicle electrical system voltage ($U_{Batt}$) and on the other hand the first switch circuit (E21) is connected to the first contact branch (K1) and the third switch circuit (E22) is connected to the second contact branch (K2).

9. The method as claimed in claim 2, further comprising in that the second contact branch (K2) is connected to a second potential of the vehicle electrical system voltage ($U_{Batt}$) of the vehicle.

10. The method as claimed in claim 9, further comprising in that:

the operating switch (SW1) can be actuated into a second switch position having a first and thereto parallel second and third switch circuit (E21, E22, E23), the second switch circuit (E21) is connected at one end to a first potential of the vehicle electrical system voltage ($U_{Batt1}$), and at the other end to the first contact branch (K1), and the second and third switch circuit (E22, E23) at one end to the second potential of the vehicle electrical system ($U_{Batt}$) and at the other end the second switch circuit (E22) is connected to the second contact branch (K2) and the third switch circuit (E23) is connected to the third contact branch (K3).

11. The method as claimed in claim 9 further comprising in that the first potential of the vehicle electrical system voltage ($U_{Batt}$) represents the positive potential (14V) of the vehicle electrical system voltage ($U_{Batt}$) and the second potential is the vehicle ground (GND).

12. The method as claimed in claim 9 further comprising in that the first potential of the vehicle electrical system voltage ($U_{Batt}$) represents, the vehicle ground (GND) and the second potential represents the positive potential (14V) of the vehicle electrical system voltage ($U_{Batt}$).

13. The method as claimed in claim 2 further comprising in that in order to continue to detect a plurality of the faults, the vehicle electrical system voltage ($U_{Batt}$) or a reference voltage (GND) of the vehicle electrical system voltage ($U_{Batt}$) is applied to the first or second contact branch (K1, K2, KN1, KN2) by means of the evaluating unit (ST1) and in dependence upon the switch position of the operating switch (SW1) the potentials that are being applied on the signal lines (L1, L2, LN1, LN2) of the contact branches (K1, K2, KN1, KN2) are sensed and evaluated.

14. The method as claimed in claim 1, further comprising in that:

the operating switch (SW1) can be actuated into a second switch position having a second and thereto parallel third switch circuit (E21, E22), the second switch circuit (E21) is connected at one end to the first potential of the vehicle electrical system voltage ($U_{Batt}$) and at the other end to the second contact branch (K2), and the third switch circuit (E22) is connected at one end to the second potential of the vehicle electrical system voltage ($U_{Batt}$) and at the other end to the first contract branch (K1).

15. The method as claimed in claim 1 further comprising in that the providing each of the switch circuits (E1, E11, . . . E23) with a contact element.

16. The method as claimed in claim 15 further comprising in that the switching contact elements (S1.1, . . . S2.3) of the operating element (SW1) are protected by means of a current limiting element (R1, R1.1, . . . R2.3).

17. The method as claimed in claim 1 further comprising in that the operating switch (SW1) is embodied with at least one light-emitting diode (LED) that is connected by way of an LED line (L3) to the evaluating unit (ST1).

18. The method as claimed in claim 17 further comprising in that a reference potential of the vehicle electrical system is supplied from the evaluating unit (ST1) to the operating switch (SW1) by way of the LED line (L3).

19. An operating switch (SW1) comprising at least one make-contact element (S1, S1.1) that forms a first switch circuit (E1, E11) for initiating a vehicle function of a vehicle, which operating switch is connected to an evaluating unit (ST1) by means of at least a first signal line (L1), the first switch circuit (E1, E11) is connected at one end to a first potential of the vehicle electrical system voltage ($U_{Batt}$) of the vehicle and is connected at the other end to the first signal line (L1, LN1) in order to form a first contact branch (K1) in a first switch position, a first diode device (DR1, DR1.1) is provided that bridges the first switch circuit in the non-conducting direction with respect to the first potential of the vehicle electrical system voltage ($U_{Batt}$), the evaluating unit (ST1) comprises a test voltage generating unit (SP, IF1, IF2, IF3) for generating a test voltage ($U_{Test}$), the magnitude of which is greater than the first potential, the evaluating unit (ST1) is configured to apply the test voltage ($U_{Test}$) to the signal line (L1, LN1) of the first contact branch (K1) and to evaluate the potential that is being applied to the first signal line (L1, LN1) of the first contact branch (K1) in order to detect a fault.

20. The operating switch (SW1) as claimed in claim 19, further comprising in that:

the operating switch (SW1) in the first switch position is embodied with a second parallel switch circuit (E12), a second diode device (DR1.2) is provided that bridges the second switch circuit (E12) in the non-conducting direction with respect to the first potential of the vehicle electrical system voltage ($U_{Batt}$), and in order to form a second contact branch (K2, KN2) the second switch circuit (E12) can be connected by way of a second signal line (L2, LN2) to the evaluating unit.

21. The operating switch (SW1) as claimed in claim 20, further comprising in that the second contact branch (K2, KN2) is connected to the first potential of the vehicle electrical system voltage ($U_{Batt}$) of the vehicle.

22. The operating switch (SW1) as claimed in claim 20, further comprising in that the second contact branch (K2) is connected to a second potential of the vehicle electrical system voltage ($U_{Batt}$) of the vehicle.

23. The operating switch (SW1) as claimed in claim 22, further comprising in that:

the operating switch (SW1) in a second switch position is embodied with a second and thereto parallel third switch circuit (E21, E22), and the second and third switch circuit (E21, E22) are connected on the one hand to the second potential of the vehicle electrical system voltage ($U_{Batt}$) and on the other hand the first switch circuit (E21) is connected to the first contact branch (K1, KN1) and the second switch circuit (E22) is connected to the second contact branch (K2, KN2).

24. The operating switch (SW1) as claimed in claim 22, further comprising in that:

the operating switch (SW1) in a second switch position is embodied with a second and thereto parallel third switch circuit (E21, E22), the first switch circuit (E21) is connected at one end to the first potential of the vehicle electrical system voltage ($U_{Batt}$) and at the other end to the first contact branch (K1), and the second switch circuit (E22) is connected at one end to a second potential of the vehicle electrical system voltage ($U_{Batt}$) and at the other end to the second contact branch (K2).

25. The operating switch (SW1) as claimed in claims 22 further comprising in that the first potential of the vehicle electrical system voltage ($U_{Batt}$) represents the positive potential (14V), and the second potential represents the vehicle ground (GND).

26. The operating switch (SW1) as claimed in claim 22 further comprising in that the first potential of the vehicle electrical system voltage ($U_{Batt}$) represents the vehicle ground (GND), and the second potential represents the positive potential (14V) of the vehicle electrical system voltage ($U_{Batt}$).

27. The operating switch (SW1) as claimed in claim 20, further comprising in that:

the operating switch (SW1) in the first switch position is embodied with a third parallel switch circuit (E13), a third diode device (DR1.3) is provided that bridges the third switch circuit (E1.3) in the non-conducting direction with respect to the first potential of the vehicle electrical system voltage ($U_{Batt}$), and in order to form a third contact branch (K3) the third switch circuit (E13) is connected by way of a third signal line (L3) to the evaluating unit (ST1).

28. The operating switch (SW1) as claimed in claim 27, further comprising in that the third contact branch (K3) is connected to a potential of a second vehicle electrical system voltage ($U_{Batt2}$).

29. The operating switch (SW1) as claimed in claim 28, further comprising in that:

the operating switch (SW1) in a second switch position is embodied with a first and thereto parallel second and third switch circuit (E21, E22, E23), and the first, second and third switch circuit (E21, E22, E23) are connected on the one hand to a second potential of the vehicle electrical system voltage ($U_{Batt}$) and on the other hand the first switch circuit (E21) is connected to the first contact branch (K1), the second switch circuit (E22) is connected to the second contact branch (K2) and the third switch circuit (E23) is connected to the third contact branch (K3).

30. The operating switch (SW1) as claimed in claim 27, further comprising in that the third contact branch (K3) is connected to a second potential of the vehicle electrical system voltage ($U_{Batt}$) of the vehicle.

31. The operating switch (SW1) as claimed in claim 30, further comprising in that:

the operating switch (SW1) in a second switch position is embodied with a second and thereto parallel second switch circuit (E21, E22, E23), the first switch circuit (E21) is connected at one end to the first potential of the vehicle electrical system voltage ($U_{Batt1}$), and at the other end to the first contact branch (K1), the second and third switch circuit (E22, E23) at one end to a second potential of the vehicle electrical system ($U_{Batt}$) and at the other end the second switch circuit (E22) is connected to the second contact branch (K2) and the third switch circuit (E23) is connected to the third contact branch (K3).

32. Use of an operating switch (SW1) as claimed claims 19 in a motor vehicle, in order to actuate an electric parking brake system.

* * * * *

UNITED STATES PATENT AND TRADEMARK OFFICE
CERTIFICATE OF CORRECTION

| | |
|---|---|
| PATENT NO. | : 8,957,684 B2 |
| APPLICATION NO. | : 13/885363 |
| DATED | : February 17, 2015 |
| INVENTOR(S) | : Andreas Heise et al. |

It is certified that error appears in the above-identified patent and that said Letters Patent is hereby corrected as shown below:

In the Claims

In Column 22, claim 32, line 56, after "claimed" insert --in-- and delete "claims" and insert --claim--.

Signed and Sealed this
Ninth Day of June, 2015

Michelle K. Lee
*Director of the United States Patent and Trademark Office*